(12) United States Patent
Terui

(10) Patent No.: US 6,971,158 B2
(45) Date of Patent: Dec. 6, 2005

(54) ELECTRIC-COMPONENT MOUNTING SYSTEM INCLUDING MOVABLE SUBSTRATE-HOLDING DEVICE

(75) Inventor: Seiichi Terui, Anjo (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 476 days.

(21) Appl. No.: 10/306,001

(22) Filed: Nov. 29, 2002

(65) Prior Publication Data

US 2003/0106207 A1    Jun. 12, 2003

(30) Foreign Application Priority Data

Dec. 7, 2001   (JP) ............................. 2001-373983

(51) Int. Cl.⁷ ............................................... B23P 19/00
(52) U.S. Cl. ........................... 29/740; 29/739; 29/741; 29/743; 29/833
(58) Field of Search ........................... 29/739, 740, 741, 29/755, 833

(56) References Cited

U.S. PATENT DOCUMENTS

| | | |
|---|---|---|
| 4,231,153 A | 11/1980 | Browne |
| 4,346,514 A | 8/1982 | Makizawa et al. |
| 4,573,262 A | 3/1986 | Dornes et al. |
| 4,631,812 A | 12/1986 | Young |
| 4,719,694 A | 1/1988 | Herberich et al. |
| 5,086,559 A | 2/1992 | Akatsuchi |
| 5,145,047 A | 9/1992 | Terracol et al. |
| 5,191,702 A | 3/1993 | Gocdecke et al. |
| 5,208,969 A | 5/1993 | Hidese |
| 5,671,527 A | 9/1997 | Asai et al. |
| 5,711,065 A | 1/1998 | Asai et al. |
| 5,864,944 A * | 2/1999 | Kashiwagi et al. .......... 29/833 |
| 6,101,709 A * | 8/2000 | Shiota ......................... 29/833 |
| 6,216,341 B1 * | 4/2001 | Nakahara ..................... 29/833 |
| 6,446,333 B1 * | 9/2002 | Kashiwagi et al. .......... 29/833 |
| 6,538,425 B1 * | 3/2003 | Kawada ................... 324/158.1 |
| 6,739,036 B2 * | 5/2004 | Koike et al. ................. 29/743 |
| 6,861,269 B2 * | 3/2005 | Kawai et al. ................. 438/14 |

FOREIGN PATENT DOCUMENTS

| | | |
|---|---|---|
| DE | 41 06 689 A1 | 10/1991 |
| EP | 0 389 048 A1 | 9/1990 |
| EP | 0 491 448 A1 | 6/1992 |
| SU | 1829131 A1 | 7/1993 |

* cited by examiner

*Primary Examiner*—Carl J. Arbes
(74) *Attorney, Agent, or Firm*—Oliff & Berridge, PLC

(57) ABSTRACT

An electric-component mounting system including component-mounting devices arranged in an array and each having a component-holding head for holding an electric component, and a head-moving device to move the head, and a substrate-transferring device to move at least one substrate on which electric components are to be mounted, and wherein the substrate-transferring device stops each substrate at at least one stop position which corresponds to at least one of the component-mounting devices and at which operations of the component-mounting devices are concurrently performed on the at least one substrate. The substrate-transferring device includes a first transferring device to move each substrate along a path parallel to the array of the component-mounting devices and stop each substrate at least once during its movement along the path, and a second transferring device having a substrate-holding device to hold each substrate at each stop position and a holding-device moving device to reciprocate the substrate-holding device by a maximum distance smaller than a maximum distance of movement of each substrate by the first transferring device, so that each substrate is moved together with the substrate-holding device.

21 Claims, 10 Drawing Sheets

ELECTRIC-COMPONENT MOUNTING SYSTEM INCLUDING MOVABLE SUBSTRATE-HOLDING DEVICE

The present application is based on Japanese Patent Application No. 2001-373983 filed Dec. 7, 2001, the content of which is incorporated herein by reference.

BACKGROUND OF THE INVENTION

1. Field of the Invention

The present invention relates in general to an electric-component mounting system provided with a component-mounting device arranged to mount electric components (including electronic components) on a circuit substrate, and more particularly to techniques for improving mounting accuracy of the electric components on a circuit substrate which is larger than a component mountable area of the component-mounting device.

2. Discussion of Related Art

One type of known electric-component mounting system includes a plurality of component-mounting devices arranged in series with each other along a line, and a substrate-transferring device disposed so as to extend along the line of the component-mounting devices. Each component-mounting device includes a component-holding head operable to hold an electric component, and a head moving device arranged to move the component-holding head. The substrate-transferring device is arranged to transfer at least one circuit substrate on which electric components are to be mounted. Each circuit substrate is stopped at a predetermined component-mounting position aligned with a corresponding one of the component-mounting devices, so that operations to mount the electric components on the circuit substrates are concurrently performed by the respective component-mounting devices. Usually, the substrate-transferring device is of a chain track type or endless track type including a conveyor, for example. When the component mounting operations are performed on a circuit substrate which is larger than a component mountable area of the component-holding head of the corresponding component-mounting device in the electric-component mounting system of the type described, some of the predetermined electric components are first mounted in a portion of the component-mounting area of the circuit substrate which corresponds to the component mountable area of the component-holding head, and then the other electric components are mounted in the other portion of the component-mounting area of the circuit substrate, after the circuit substrate is fed downwards by an appropriate distance. In some electric-component mounting systems of this type, a fiducial-mark imaging device arranged to take images of a plurality of fiducial marks provided on each circuit substrate is disposed upstream of the most upstream one of the component-mounting devices, so that the images of the fiducial marks are taken before the circuit substrate is transferred to the component-mounting position aligned with the corresponding component-mounting device. In most cases, the fiducial marks which are provided to accurately detect positioning errors of each circuit substrate are disposed at respective positions on the circuit substrate, which are spaced from each other, for instance, in the direction of transfer of the circuit substrate, or at two positions which are located in respective two diagonally opposed corner portions of the rectangular circuit substrate. The fiducial-mark imaging device is movable to simultaneously take the images of the spaced-apart fiducial-marks, without having to move the circuit substrate. Image data representative of the images of the fiducial marks thus taken are compared with stored reference image data representative of the nominal positions of the fiducial marks, to calculate positioning errors of the circuit substrate. The calculated positioning errors are fed to the component-mounting devices as the circuit substrate is transferred, so that positions to which the component-holding head of each component-mounting device is moved to mount the electric components on the circuit substrate are adjusted so as to eliminate the positioning errors of the circuit substrate when the electric components are mounted at the predetermined mounting positions.

However, the positioning accuracy of the electric components mounted on the circuit substrates is influenced by accuracy of feeding of the circuit substrates by a feeding mechanism of the substrate-transferring device after the imaging of the fiducial marks. Accordingly, the electric-component mounting system including a plurality of component-mounting devices arranged in series with each other suffers from difficulty in maintaining a high degree of positioning accuracy of the electric components mounted on the circuit substrates. To improve the positioning accuracy of each circuit substrate at the component-mounting position, the circuit substrate may be transferred downwards together with a pallet while the circuit substrate is fixed in position on the pallet. In this case, however, a pallet transferring device for transferring the pallet downwards with high positioning accuracy is required as well as the pallet. In addition, a device for returning the pallet to the original position upstream of the component-mounting devices is also required, so that the substrate-transferring device tends to be complicated in construction.

Each of the plurality of component-mounting devices of the electric-component mounting system may be provided with a fiducial-mark imaging device, which is arranged to be moved by the head moving device, to take the images of the fiducial marks on each circuit substrate each time the circuit substrate is stopped at the component-mounting position corresponding to each component-mounting device. In this case, the errors of positioning of the circuit substrate relative to the component-mounting device are detected on the basis of the images of the fiducial marks, and the component-mounting accuracy can be improved. However, an area in which the fiducial-mark imaging device is movable almost entirely overlaps the component mountable area of the component-holding head of the component-mounting device. When the electric components are mounted on a circuit substrate which is larger than the component mountable area of the component-holding head, the fiducial-mark imaging device is not able to take the images of all of the mutually spaced-apart fiducial marks provided on the circuit substrate. Therefore, the electric-component mounting system wherein each component-mounting device is provided with the fiducial-mark imaging device is not capable of dealing with the circuit substrates which are larger than the component mountable area of the component-mounting device.

SUMMARY OF THE INVENTION

It is therefore an object of the present invention to provide an electric-component mounting system which permits electric components to be mounted with high accuracy on a circuit substrate which is larger than the component mountable area of its component-holding head. This object may be achieved according to any one of the following modes of the present invention, each of which is numbered like the appended claims and depends from the other mode or modes, where appropriate, for easier understanding of technical features disclosed in the present application and possible combinations of those features. However, it is to be understood that the invention is not limited to those technical features or combinations thereof, and that any one of a plurality of technical features described below with respect to any one mode of the invention may be a subject matter of the present invention, without the other technical feature or features being combined with that one technical feature.

(1) An electric-component mounting system for mounting electric components on at least one circuit substrate, comprising:

a plurality of component-mounting devices which are arranged in series with each other and each of which includes a component-holding head operable to hold an electric component, and a head-moving device operable to move the component-holding head; and a substrate-transferring device disposed so as to extend along an array of the plurality of component-mounting devices and operable to move the at least one circuit substrate and stop the at least one circuit substrate at at least one stop position which respectively corresponds to at least one of the plurality of component-mounting devices and at which the at least one component-mounting device mounts the electric components on the at least one circuit substrate, and wherein the substrate-transferring device includes (a) a first transferring device operable to move the at least one circuit substrate, along at least a path from an upstream end to a downstream end of the array of the plurality of component-mounting devices, and stop the at lest one circuit substrate at least once during movement thereof along the path, and (b) a second transferring device comprising a substrate-holding device operable to fixedly hold the at least one circuit substrate at each of the at least one stop position established by the first transferring device, and a holding-device moving device operable to reciprocate the substrate-holding device in a direction of movement of the at least one circuit substrate by the first transferring device, by a maximum distance smaller than a maximum distance of movement of the at least one circuit substrate by the first transferring device, so that the at least one circuit substrate held by the substrate-holding device is moved together with the substrate-holding device.

In the electric-component mounting system constructed according to the above mode (1) of the present invention, the plurality of component-mounting devices are arranged in series with each other, and each circuit substrate is moved by the first transferring device along a path from the upstream end to the downstream end of the array of the component-mounting devices. The first transferring device stops each circuit substrate at least once during its movement along the path, and the substrate-holding device of the second transferring device holds each circuit substrate stopped by the first transferring device, such that the circuit substrate is not movable relative to the substrate-holding device. The substrate-holding device fixedly holding each circuit substrate is reciprocated by the holding-device moving device of the second transferring device, to move each circuit substrate in the direction of movement of the substrate by the first transferring device. Although each circuit substrate is movable by the first and second transferring devices in the direction parallel to the array of the plurality of component-mounting devices, the these two transferring devices are transferring devices of different types, which cooperate with each other to improve a freedom in the movement of each circuit substrate. For instance, the first transferring device which is provided to move each circuit substrate along the path extending from the upstream end to the downstream end of the array may be arranged to stop each circuit substrate with a comparatively low degree of positioning accuracy at each stop position, while the second transferring device may be arranged to position and hold each circuit substrate with a comparatively high degree of positioning accuracy and stop each circuit substrate at a desired position with a comparatively high degree of positioning accuracy, so that the electric components can be accurately mounted on the circuit substrate accurately positioned by the second transferring device, by the component-mounting devices.

Where the required accuracy of positioning of each circuit substrate by the first transferring device is comparatively low, as described above, the construction of the first transferring device may be simplified, and the required cost of manufacture of the first transferring may be accordingly reduced. For example, the first transferring device includes a belt conveyor or any other type of conveyor arranged to move each circuit substrate along an endless path. A transferring device of this endless or chain track type is capable of moving each circuit substrate by a maximum distance almost equal to its length. On the other hand, the second transferring device which is arranged to move the substrate-holding device fixedly holding each circuit substrate permits a comparatively high degree of accuracy of positioning of each circuit substrate at a desired position. However, the second transferring device requires a space for permitting a movement of the substrate-holding device, in addition to an installation space for the substrate-holding device. In this respect, it is desirable to minimize the maximum distance of reciprocating movement of the substrate-holding device. Although the maximum distance of reciprocating movement of the substrate-holding device may be made large enough to move each circuit substrate between the upstream and downstream ends of the array of the component-mounting devices, this arrangement requires the length of the second transferring device in the direction of transfer of each circuit substrate, to be considerably larger than the length of the first transferring device and the length of the array of the component-mounting devices. In view of this drawback, the maximum distance of reciprocation of the substrate-holding device by the holding-device moving device of the second transferring device is made smaller than the maximum distance of movement of each circuit substrate by the first transferring device, according to the principle of the present invention.

In summary, the first and second transferring devices of the substrate-transferring device provided in the present electric-component mounting system are constructed and arranged so as to make up for their drawbacks, and cooperate to not only increase the maximum distance of movement of each circuit substrate of the substrate-transferring device and but also improve the accuracy of positioning of the circuit substrate by the substrate-transferring device.

(2) An electric-component mounting system according to the above mode (1), wherein the first transferring device comprises a belt conveyor arranged to move the at least one circuit substrate while supporting each of the at least one circuit substrate in contact with a lower surface of each circuit substrate.

(3) An electric-component mounting system according to the above mode (2), wherein the substrate-holding device includes a holder portion arranged to grip each circuit substrate in a vertical direction, at a first portion of each circuit substrate which is spaced from a second portion thereof at which each circuit substrate is supported on its lower surface by the belt conveyor of the first transferring device, the first portion being spaced from the second portion in a direction perpendicular to the direction of movement of the at least one circuit substrate by the first transferring device.

The belt conveyor preferably includes two sets of a conveyor belt, a belt guide and a belt drive device, as described below. However, the belt conveyor may include a single conveyor belt which has a comparatively large width and which is arranged to move each circuit substrate while supporting each circuit substrate in contact with a portion of its lower surface which is intermediate in the width direction perpendicular to the direction of movement of each circuit substrate. In this case, the substrate-holding device of the second transferring device is required to hold two portions of each circuit substrate which are located on the opposite sides of the conveyor belt. Where the belt conveyor includes the two sets of conveyor belt, belt guide and belt drive devices as indicated above, the substrate-holding device is arranged to grip portions of each circuit substrate which are located either inwardly or outwardly of the portions at which each circuit substrate is supported by the two conveyor belts. In either of these two cases, the holder portion of the substrate-holding device is preferably arranged to grip each circuit substrate in the vertical direction, at lateral end portions of the substrate opposite to each other in the width direction. In this arrangement in which the each circuit substrate is fixedly held at its relatively narrow lateral end portions, each circuit substrate has a relatively large area in which the electric components can be mounted.

In the electric-component mounting system according to the above mode (3) in which the holder portion of the substrate-holding device grips each circuit substrate in the vertical direction, it is possible to effectively prevent an undesirable displacement of each circuit substrate relative to the substrate-holding device. However, the arrangement of the substrate-holding device according to the above mode (3) is not essential. For instance, the substrate-holding device may include at least one support member which is located below each circuit substrate to support the circuit substrate and which is provided with a sucker capable of holding the circuit substrate by suction under a negative pressure. This arrangement also prevents a displacement of each circuit substrate relative to the substrate-holding device.

(4) An electric-component mounting system according to the above mode (2), wherein the belt conveyor includes two conveyor units each including a conveyor belt, a belt guide and a belt drive device operable to rotate the conveyor belt, the two conveyor units supporting respective opposite lateral portions of each circuit substrate parallel to the direction of movement of the at least one circuit substrate, and cooperating with each other to move the each circuit substrate.

Where the belt conveyor includes the two conveyor units each including a conveyor belt, a belt guide and a belt drive device according to the above mode (4), each circuit substrate is supported at its opposite lateral portions by the respective two conveyor belts, so that at least one support member described below with respect to the following mode (5) may be provided, and a distance between the two conveyor belts can be adjusted depending upon the width of the at least one circuit substrate.

(5) An electric-component mounting system according to the above mode (4), wherein the substrate-holding device of the second transferring device includes at least one support member which is located between said two conveyor units and each of which supports said each circuit substrate in contact with said lower surface, at a corresponding one of at least one local position of said each circuit substrate between said two conveyor units.

Where each circuit substrate has a relatively large width, the circuit substrate is desirably supported at an intermediate portion of its width, as well as at its opposite lateral portions, in order to prevent deflection or flexure of the circuit substrate at its intermediate portion. However, the electric components are often mounted on both of the upper and lower surfaces of each circuit substrate. When each circuit substrate is supported on its lower surface after the electric components have been mounted on the lower surface, the circuit substrate must be supported at a local portion or portions, while avoiding an interference of the support member or members with the electronic components mounted on the lower surface. In this respect, the substrate-holding device according to the above mode 5) is suitable to prevent the interference.

(6) An electric-component mounting system according to the above mode (4) or (5), wherein the substrate-holding device of the second transferring device includes two holder portions arranged to grip each circuit substrate in a vertical direction, at respective portions of each circuit substrate which are inwardly spaced from the opposite end portions thereof at which each circuit substrate is supported on its lower surface by the two conveyor units.

Where each circuit substrate is supported at its opposite end portions by the relatively narrow conveyor belts, the circuit substrate is desirably supported by the two holder portions at the respective portions inwardly spaced from the opposite end portions.

(7) An electric-component mounting system according to the above mode (4) or (5), wherein the substrate-holding device of the second transferring device includes two holder portions arranged to grip said each circuit substrate in a vertical direction, at respective opposite end portions of each circuit substrate which extend outwardly from the opposite lateral portions thereof at which each circuit substrate is supported on its lower surface by the two conveyor units.

(8) An electric-component mounting system according to any one of the above modes (1)–(7), wherein the first transferring device is moved together with the substrate-holding device by the holding-device moving device.

In the electric-component mounting system according to the above mode (8), the first transferring device and the substrate-holding device of the second transferring device may include a common main body. In this case, the substrate-holding device can be made relatively simple in construction.

(9) An electric-component mounting system according to any one of the above modes (1)–(7), wherein the first transferring device includes a main body disposed immovably relative to the plurality of component-mounting devices, and the substrate-holding device is disposed movably relative to the main body of the first transferring device.

Where the main body of the first transferring device is separate from the main body of the substrate-holding device and is not moved together with the substrate-holding device by the holding-device moving device, it is not necessary to provide a space for permitting the first transferring device to be moved. Accordingly, the required overall installation space for the electronic-component mounting system including the substrate-transferring device according to the above mode (9) can be reduced. Where two substrate-transferring devices are provided on the upstream and downstream sides of the substrate-transferring device of the present electric-component mounting system, the arrangement according to the above mode (9) does not require spaces between those two other substrate-transferring devices and the substrate-transferring device of the present system, for permitting the movement of the main body of the first transferring device. Accordingly, a transfer of a circuit substrate from the upstream substrate-transferring device onto the first transferring device and a transfer of another circuit substrate from the first transferring device onto the downstream substrate-transferring device can be effected concurrently.

(10) An electric-component mounting system according to any one of the above modes (1)–(9), wherein each of the plurality of component-mounting devices includes an imaging device operable to obtain image data of fiducial marks provided on each of the at least one circuit substrate held by the substrate-holding device, the electric-component mounting system further comprising an image data processing device operable to positioning errors of the at least one circuit substrate as held by the substrate-holding device, on the basis of the image data of the fiducial marks obtained by the imaging device.

In the electric-component mounting system according to the above mode (10), the fiducial marks provided on each circuit substrate held by the substrate-holding device are imaged by the imaging device, to obtain the positioning errors of the circuit substrate as held by the substrate-holding device, so that the obtained positioning errors are eliminated when the electric components are mounted on the circuit substrate by the component-mounting devices. Since the positioning errors of each circuit substrate will not vary due to a movement of the substrate-holding device, the electric components can be mounted on the circuit substrate with high positioning accuracy after the circuit substrate is moved with the substrate-holding device, provided the movement of the substrate-holding device is controlled with high positioning accuracy.

Where the substrate-holding device is provided with a positioning device capable of positioning each circuit substrate with high accuracy, the imaging device is not essential according to the principle of the present invention. Where the imaging device is provided, on the other hand, the substrate-holding device is not required to be provided with such a positioning device, or the positioning device is not required to position each circuit substrate with high accuracy. Generally, the electric components can be mounted on each circuit substrate with higher accuracy, where the positioning errors of the imaging device are detected by the imaging device to eliminate the positioning errors upon mounting of the electric components, than where the circuit substrate is accurately positioned by the positioning device.

(11) An electric-component mounting system according to the above mode (10), wherein the imaging device is moved with the component-holding head by the head-moving device.

Where the imaging device is moved by a suitable moving device, the two or more fiducial marks can be imaged by the same imaging device. In the electric-component mounting system according to the above mode (11), the head-moving device is used as the moving device for moving the imaging device, so that the system is available at a reduced cost.

(12) An electric-component mounting system according to any one of claims (1)–(11), wherein the substrate-holding device has a length larger than a distance between a downstream end of a component mountable area of a most downstream one of the plurality of component-mounting devices and an upstream end of a component mountable area of a most upstream one of the component-mounting devices.

In the electric-component mounting system according to the above mode (12) in which the length of the substrate-holding device is larger than the distance between the opposite ends of the array of the component-mounting devices, the substrate-holding device is able to hold a plurality of circuit substrates arranged in series with each other, so that the component-mounting devices can concurrently perform operations to mount the electric components on those circuit substrates. Alternatively, the substrate-holding device is able to hold a long single circuit substrate having a plurality of component-mounting areas in which the electric components are concurrently mounted by the respective component-mounting devices.

(13) An electric-component mounting system according to any one of the above modes (1)–(12), wherein the plurality of component-mounting devices consist of at least three component-mounting devices arranged in series with each other.

While the principle of the present invention is applicable to an electric-component mounting system comprising two component-mounting devices, the present invention is more advantageously applicable to an electric-component mounting system comprising three or more component-mounting devices arranged in series with each other.

(14) An electric-component mounting system according to claim 13, wherein said at least three component-mounting devices are arranged at a predetermined constant pitch.

Although it is not essential that the at least three component-mounting devices be arranged at a predetermined constant pitch, the at least three component-mounting devices are desirably arranged at a constant pitch, for simplification of control of the component-mounting operations performed by the component-mounting devices.

(15) An electric-component mounting system according to any one of the above modes (1)–(14), wherein the maximum distance of movement of the substrate-holding device by the holding-device moving device is not larger than a center-to-center distance of adjacent ones of the plurality of component-mounting devices.

While the maximum distance of movement of the substrate-holding device by the holding-device moving may be larger than the center-to-center distance of the adjacent component-mounting devices, an advantage to be obtained by the maximum distance of movement larger than the center-to-center distance does not usually justify an increase in the cost of manufacture of the holding-device moving device which is required to obtain that advantage.

(16) An electric-component mounting system according to the above mode (15), wherein the maximum distance of movement of the substrate-holding device by the holding-device moving device is not larger than a spacing distance between component mountable areas of adjacent ones of the plurality of component-mounting devices.

Where the maximum distance of movement of the substrate-holding device by the holding-device moving device is equal to the spacing distance between the component mountable areas of the adjacent component-mounting devices, the electric components can be mounted in any area of each circuit substrate held by the substrate-holding device. However, this arrangement is not essential, and the principle of this invention can be practiced even where the maximum distance of movement is smaller than the spacing distance between the component mountable areas of the adjacent component-mounting devices.

(17) An electric-component mounting system according to any one of the above modes (10)–(16), wherein the fiducial marks consist of a plurality of fiducial marks provided at respective positions on each circuit substrate, which positions which are spaced apart from each other, the electric-component mounting system further comprising an imaging control device operable to operate the imaging device to image at least one first fiducial mark selected from the plurality of fiducial marks before a movement of the substrate-holding device by the holding-device moving device, and at least one second fiducial mark selected from the plurality of fiducial marks after the movement of the substrate-holding device, the at least one second fiducial mark being different from the at least one first fiducial mark, and wherein the image data processing device includes a positioning-error obtaining portion operable to obtain the positioning errors of each circuit substrate as held by the substrate-holding device, on the basis of positioning errors of the at least one first fiducial mark and the at least one second fiducial mark which have been imaged by the imaging device.

In the electric-component mounting system according to the above mode (17), a plurality of fiducial marks selected from the plurality of fiducial marks provided on each circuit substrate can be imaged by the imaging device even where the imaging device is stationary. Further, fiducial marks which are not located within a movable area of the movable imaging device can be imaged by the imaging device. Accordingly, the positioning errors of each circuit substrate can be obtained on the basis of the positioning errors of the fiducial marks imaged by the imaging device.

(18) An electric-component mounting system according to any one of the above modes (10)–(12), wherein the image data processing device includes a positioning-error obtaining portion operable to obtain the positioning errors of the each circuit substrate as held by the substrate-holding device, on the basis of image data of a plurality of fiducial marks which are provided on each circuit substrate and which are imaged by at least two adjacent imaging devices of the plurality of component-mounting devices.

In the electric-component mounting system according to the above mode (18), the positioning errors of each circuit substrate can be obtained on the basis of the positioning errors of a plurality of fiducial marks which are located within movable areas of the adjacent imaging devices, or within an area which is larger than a sum of the movable areas of the adjacent imaging devices and a movable area of the substrate-holding device.

(19) An electric-component mounting system according to any one of the above modes (1)–(18), wherein the holding-device moving device includes a feedscrew and a nut which are held in engagement with each other and fixed axially immovably to one and the other of a main body of the substrate-holding device and a main body of the electric-component mounting system which movably supports the main body of the substrate-holding device, the holding-device moving device further including a motor whose operating angle is controlled with high accuracy and which is operated to rotate one of the feedscrew and the nut while the other of the feedscrew and the nut is prevented from being rotated.

While the holding-device moving device may use a linear motor, for instance, the holding-device moving device preferably includes a feedscrew, a nut and a motor as in the above mode (19).

(20) An electric-component mounting system for mounting electric components on a circuit substrate, comprising:

at least one component-mounting device each including a component-holding head operable to hold an electric component, and a head-moving device operable to move the component-holding head;

a substrate-transferring device operable to move the circuit substrate to a stop position corresponding to each of the at least one component-mounting device, and to move the circuit substrate from said position;

a substrate-holding device operable to fixedly hold the circuit substrate which has been moved to the stop position by the substrate-transferring device; and a holding-device moving device operable to move the substrate-holding device in a direction of movement of the circuit substrate by the substrate-transferring device, and wherein a plurality of areas of the circuit substrate held by the substrate-holding device are located at respective positions corresponding to the at least one component-mounting device.

(21) An electric-component mounting system according to the above mode (20), further comprising a control device for controlling the holding-device moving device to move the substrate-holding device, for successively moving the circuit substrate held by the substrate-holding device, such that the plurality of areas are located at the respective positions at which at least one component-mounting device is successively operated to mount the electric components on the respective areas.

While the electric-component mounting system according to the above mode (20) preferably includes a plurality of component-mounting device, the principle of the invention according to the above mode (20) can be practiced even where the system is provided with only one component-mounting device. For example, the system according to the above mode (20) permits mounting of the electric components on a circuit substrate which is larger than the movable area of the component-holding head of the component-mounting device. Further, the present system permits the substrate-transferring device to function as a first transferring device operable to move the circuit substrate between upstream and downstream substrate-transferring devices respectively disposed on the upstream and downstream sides of the present system, and permits the holding-device moving device to function as a second transferring device operable to position the circuit substrate, and move the circuit substrate for mounting the electric components on the circuit substrate. The electric-component mounting system according to the above mode (20) is particularly effective to mount a comparatively small number of kinds of the electric components on a comparatively large area of the circuit substrate.

It is noted that the electric-component mounting system according to the above mode (20) or (21) may incorporate any one of the technical features of the above modes (2)–(11), (17) and (19), except in that the provision of a plurality of component-mounting devices is not essential in the system of the mode (20).

BRIEF DESCRIPTION OF THE DRAWINGS

The above and other objects, features, advantages and technical and industrial significance of the present invention will be better understood by reading the following detailed description of preferred embodiment of the invention, when considered in connection with the accompanying drawings, in which.

DETAILED DESCRIPTION OF THE PREFERRED EMBODIMENTS

Figure 1:
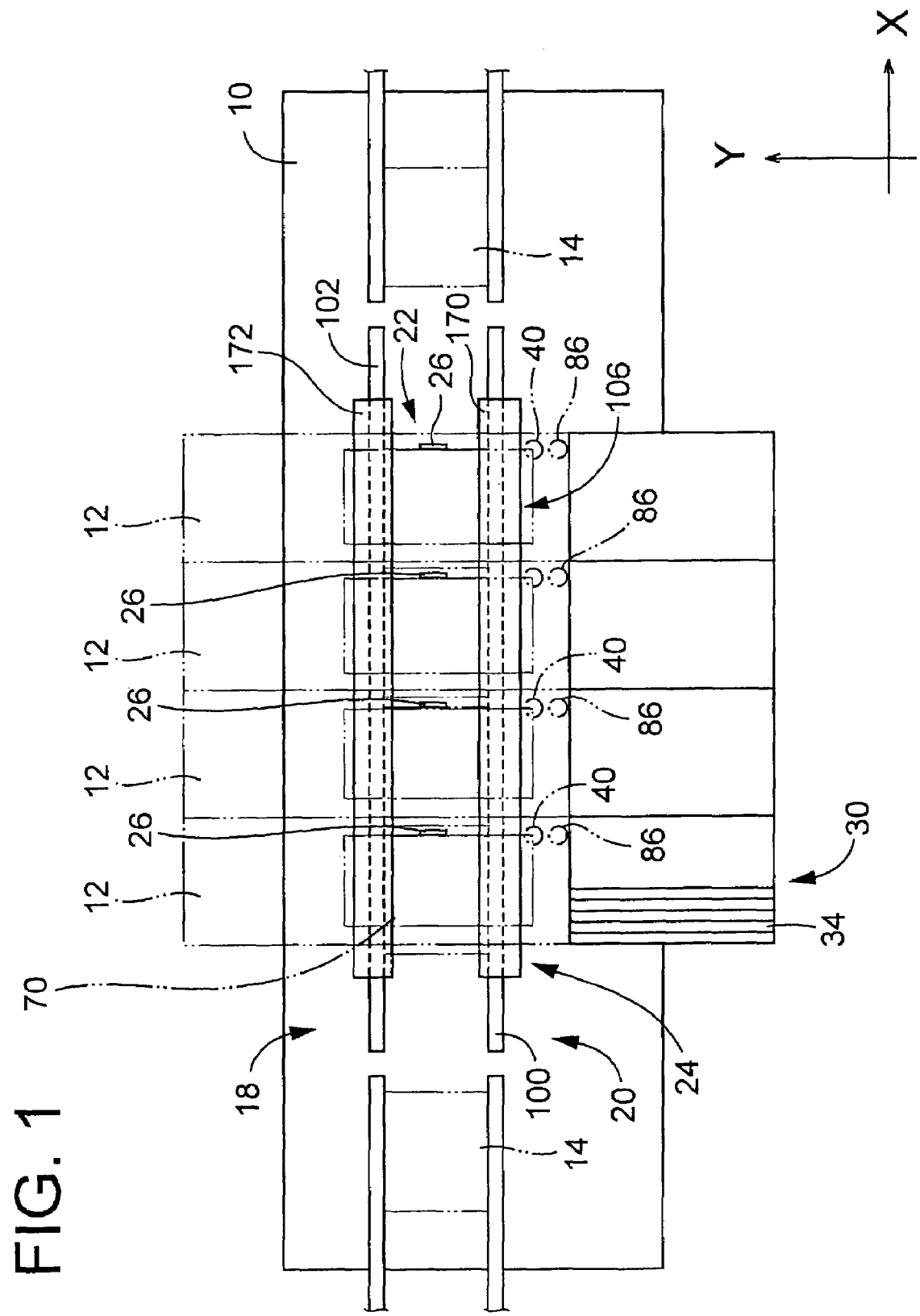
FIG. 1 is a plan schematically showing an electronic-component mounting system constructed according to one embodiment of this invention.

Referring first to FIG. 1 there is schematically shown an electric-component mounting system in the form of an electronic-component mounting system constructed according to one embodiment of this invention, which includes a machine base 10 serving as a main body of the system. On the machine base 10, there are mounted four component-mounting devices 12 which are arranged in series with each other at a predetermined pitch in a direction of transfer of circuit substrates in the form of printed-wiring boards 14. The direction of transfer of the printed-wiring boards 14 is parallel to an X-axis direction indicated in FIG. 1. In the present electronic-component mounting system, each printed-wiring board 14 is transferred from a position upstream of an array of the component-mounting devices 12 to a position downstream of this array, such that each printed-wiring board 14 is stopped at each of component-mounting positions corresponding to the component-mounting devices 12, so that electric components in the form of electronic components 16 (shown in FIG. 3) are successively or sequentially mounted and provisionally fixed on each printed-wiring board 14.

Upstream of the most upstream one of the component-mounting devices 12 in the direction of transfer of the printed-wiring boards 14, there is disposed another or upstream electronic-component mounting system. Upstream of this upstream electronic-component mounting system there is disposed a high-viscosity-fluid applying system in the form of a screen-printing system arranged to apply a highly viscous fluid in the form of a solder paste to the circuit substrates in the form of the printed-wiring boards 14. Further, a re-flow furnace system is disposed downstream of the most downstream component-mounting device 12. The re-flow furnace system is arranged to heat the solder paste into a molten state for electrically connecting the already mounted electronic components to the printed-wiring boards 14.

As shown in FIG. 1, the present electronic-component mounting system further includes a substrate-transferring device in the form of a printed-wiring-board transferring device 18 (hereinafter referred to as "PWB transferring device 18") and a component-supplying device 30, which are both mounted on the machine base 10. The PWB transferring device 18 is provided with a substrate conveyor in the form of a printed-wiring-board conveyor 20 (hereinafter referred to as "PWB conveyor 20") disposed so as to extend in the X0axis direction and arranged to transfer the printed-wiring boards 14 in the X-axis direction. The electronic-component mounting system further includes four stopper devices 22 and a substrate holding device in the form of a printed-wiring-board holding device 24 (hereinafter referred to as "PWB holding device 24"). Each printed-wiring board 14 is stopped by the corresponding stopper device 22 at the component-mounting position of each component-mounting device 12, and held by the PWB holding device 24. The four stopper devices 22 are provided for the respective component-mounting devices 12, and each stopper device 22 includes a stopper member 26, and a stopper elevating and lowering device 28 (shown in FIG. 8) operable to elevate and lower the stopper ember 26. The stopper elevating and lowering device 28 includes a drive source in the form of a fluid-operated actuator such as an air cylinder. The stopper member 26 is vertically movable by the stopper elevating and lowering device 28, between an operated position in which the stopper member 26 projects above an upper surface of each conveyor belt 122 (described below by reference to FIG. 5), to stop the printed-wiring board 14, and a non-operated position in which the stopper member 26 is retracted below the upper surface of each conveyor belt 122, to permit the printed-wiring board 14 to be moved through the corresponding component-mounting device 12. The PWB conveyor 20 of the PWB transferring device 18 and the PWB holding device 24 of each component-mounting device 12 will be described below in detail.

Figure 2:
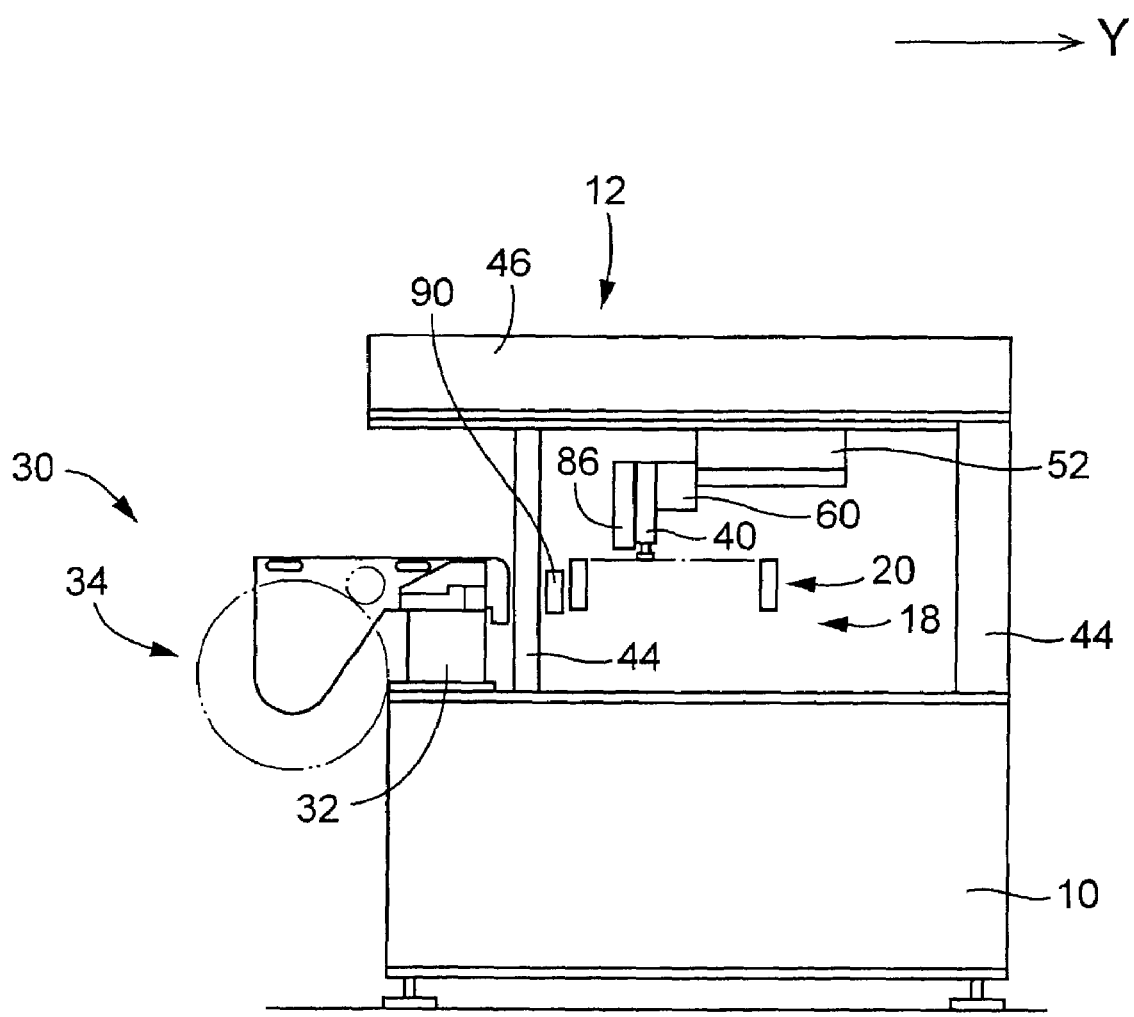
FIG. 2 is a side elevational view of the electronic-component mounting system of FIG. 1.

On one of opposite sides of the PWB conveyor 20 as seen in a Y-axis direction perpendicular to the X-axis direction in the horizontal plane of the PWB conveyor 20, there are disposed four component-supplying devices 30 corresponding to the respective four component-mounting devices 12. The component-supplying devices 30 are arranged in series with each other in the X-axis direction (direction of transfer of the printed-wiring boards 14). As shown in FIG. 2, each component-supplying device 30 includes a stationary feeder support block 32, and a multiplicity of tape feeders 34 mounted on the feeder support block 32 such that the tape feeders 34 are arranged in the X-axis direction. Each tape feeder 34 accommodates a succession of electric components in the form of electronic components 16 (FIG. 3), and is arranged to feed the electronic components 16 to its predetermined component-supply portion one after another. In the present electronic-component mounting system, each tape feeder 34 is arranged to feed a carrier tape, which has a multiplicity of recesses which are equally spaced apart from each other in the longitudinal direction and accommodate the respective electronic components 16. As the carrier tape is fed, the electronic component 16 located at the leading end of the unused portion of the carrier tape is located at the component-supply portion of the tape feeder 34 at which the electronic component 16 is picked up by a component-holding head 40 of the component-mounting device 12, as described below. Alternatively, the component-supplying device 30 may use parts feeders each of which is arranged to feed electronic components from a storage container or casing to the component-supply portion, by suitable feeding means such as an air stream, a ramp way, an oscillating motion, or a combination of these feeding means.

Figure 3:
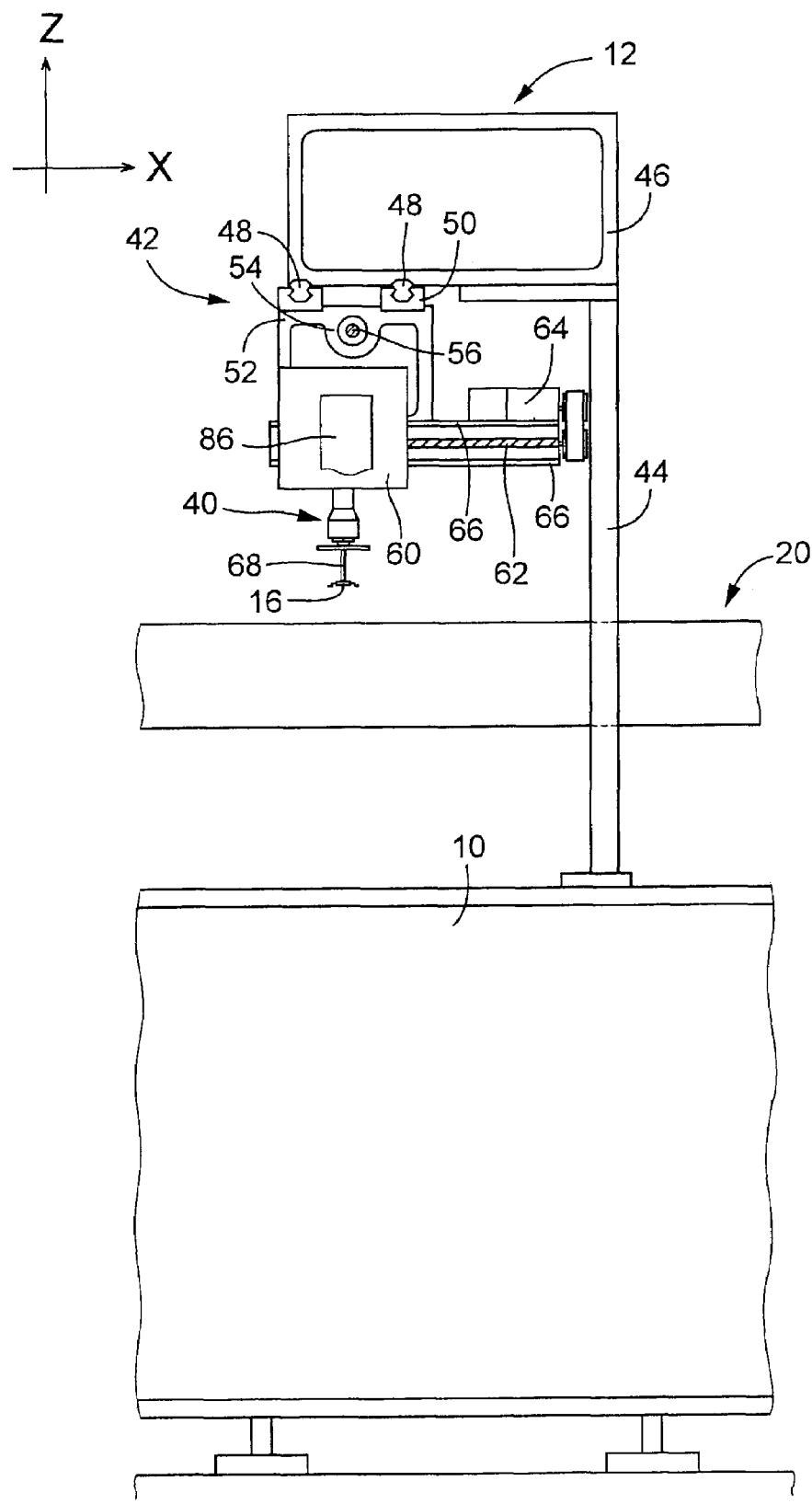
FIG. 3 is a side elevational view sowing a component-mounting device of the electronic-component mounting system.

In each component-mounting device 12, the above-indicated component-holding head 40 is movable in the X-axis and Y-axis directions, to receive the electronic component 16 from the component-supplying device 40 and move the electronic component 16 to a predetermined component-mounting spot on the printed-wiring board 14 held at the component-mounting position by the PWB holding device 24. At the component-mounting spots, the component-holding device 40 releases the electronic component 16 and mount it onto the printed-wiring board 14. To this end, the component-mounting device 12 is provided with an XY robot 42 held by an upper frame 46 which is supported by upper parts of support posts 44 and disposed above the machine base 10, as shown in FIGS. 2 and 3. On the underside of the upper frame 46, there are fixed two parallel guide rails 48 extending in the Y-axis direction in the horizontal plane. A Y-axis slide 52 is held in engagement at its guide blocks 50 with the guide rails 48 such that the Y-axis slide 52 is slidably movable in the Y-axis direction. The Y-axis slide 52 is provided with a nut 54 held in engagement with a feedscrew 56 extending in the Y-axis direction. With the feedscrew 56 rotated by a Y-axis drive motor (servomotor) 58 (shown in FIG. 8), the Y-axis slide 52 is moved in the horizontally extending Y-axis direction. It will be understood that the nut 54, the feedscrew 56 and the Y-axis slide motor 58 cooperate to constitute a Y-axis slide drive device operable to move the Y-axis slide 52, while the guide rails 48 and the guide blocks 50 cooperate to constitute a Y-axis slide guiding device for guiding the Y-axis slide 52.

On the Y-axis slide 52, an X-axis slide 60 is mounted such that the X-axis slide 60 is slidably movable on the Y-axis slide 53 in the horizontally extending X-axis direction perpendicular to the Y-axis direction. The X-axis slide 60 is provided with a nut (not shown) held in engagement with a feedscrew 62 extending in the X-axis direction. With the feedscrew 62 rotated by an X-axis drive motor (servomotor) 64, the X-axis slide 60 is moved in the X-axis direction while being guided by guide rails 66 and guide blocks (not shown). It will be understood that the feedscrew 62, the nut and the X-axis drive motor 64 cooperate to constitute an X-axis slide drive device operable to move the X-axis slide 60, while the guide rails 66 and the guide blocks cooperate to constitute an X-axis slide guiding device for guiding the X-axis slide 60. It will also be understood that the XY robot is constituted by the Y-axis slide 52, the X-axis slide 60, the Y-axis slide drive device, the X-axis drive device, the Y-axis slide guiding device and the X-axis slide guiding device. On the X-axis slide 60, there is mounted the above-indicated component-holding device 40, which is movable by the XY robot 42 to a desired position in the horizontal plane, that is, in the XY plane. The component-holding head 40 has a suction nozzle 58 removably mounted thereon and operable to hold the electronic component 16 by suction under a negative pressure.

The component-holding head 40 of each component-mounting device 12 is moved to desired positions within a component mountable area 70 indicated in FIG. 1, to mount the predetermined electronic components 16 at the respective predetermined component-mounting spots on the printed-wiring board 14, according to a predetermined mounting program, while the printed-wiring board 14 transferred by the PWB conveyor 20 is held at the component-mounting position by the PWB holding device 24. Upon completion of the operation of the component-holding head 40 to mount the electronic components 16 in the component mountable area 70 in each component-mounting device 12, each printed-wiring board 14 is fed from the present component-mounting device 12 to the component mountable area 70 in the next downstream component-mounting device 12, and the operations of the component-holding heads 40 to mount the electronic components 16 are initiated on the printed-wiring boards 14 thus loaded onto the respective component-mounting devices 12. With these component mounting operations being performed repeatedly, the four component-mounting devices 12 cooperate to mount the predetermined electronic components 16 on each of the successively fed printed-wiring boards 14.

Figure 8:
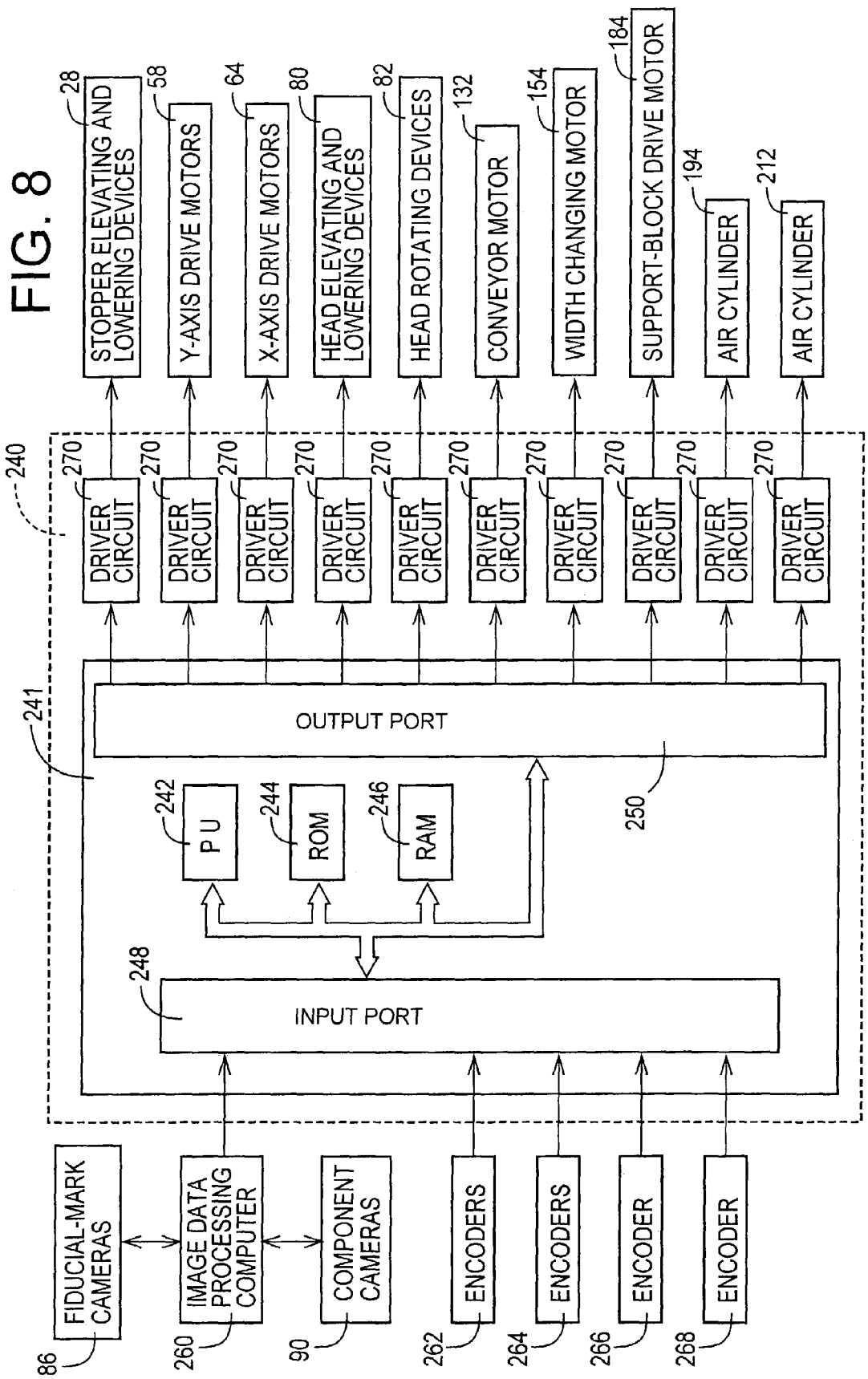
FIG. 8 is a block diagram showing a control device of the electronic-component mounting system, and some elements of the system which relate to the present invention.
Figure 9:
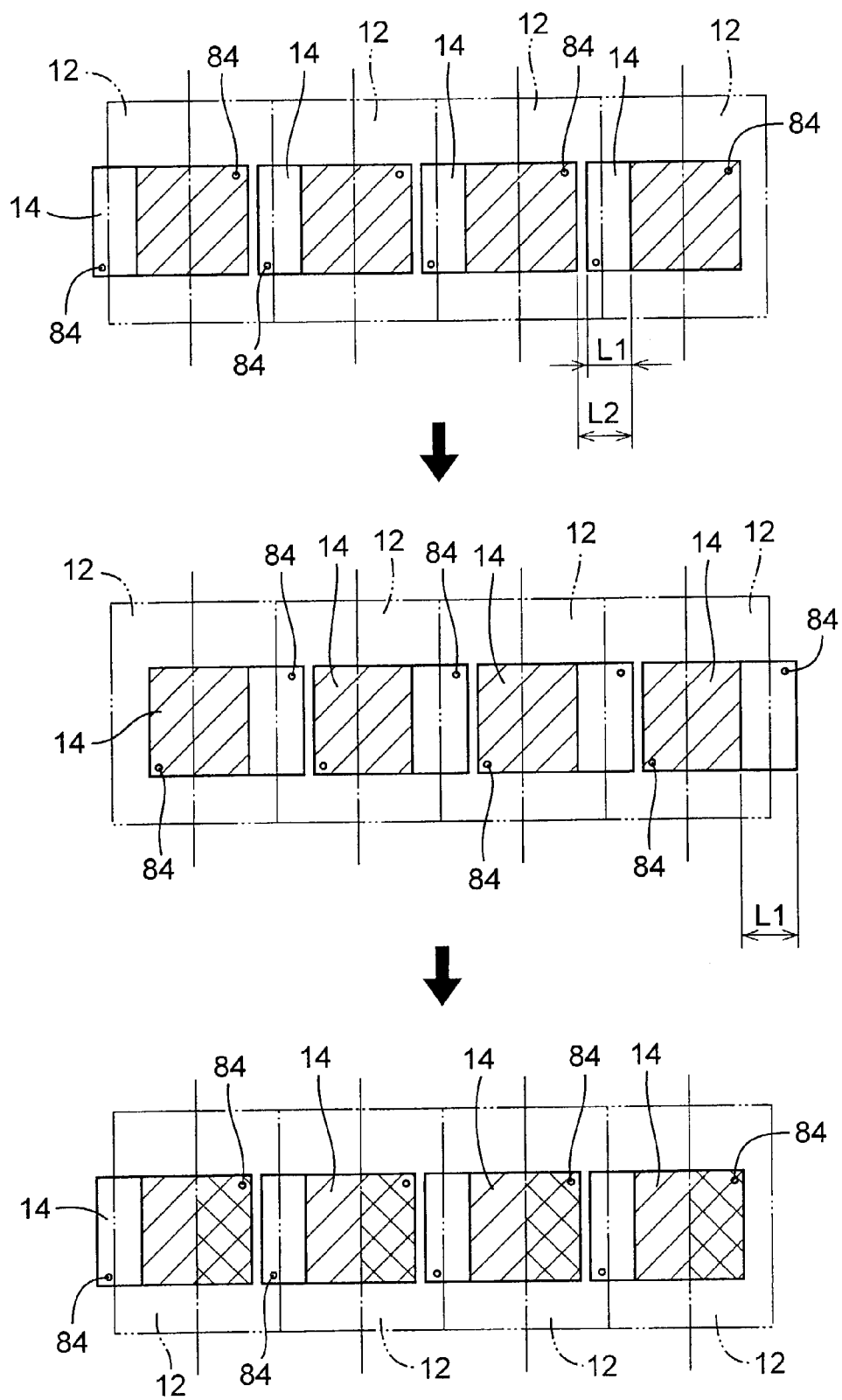
FIG. 9 is a view for explaining an example of operations to image fiducial marks and mount electronic components in the electronic-component mounting system.

On the X-axis slide 60, the component-holding head 40 is mounted such that the component-holding head 40 is vertically movable and rotatable about its axis. Each component-mounting device 12 is provided with a head elevating and lowering device 80 (shown in FIG. 8) operable to elevate and lower the component-holding head 40, and a head rotating device 82 (also shown in FIG. 8) operable to rotate the component-holding head 40 about its axis. Each of these devices 80, 82 includes a drive source in the form of an electric motor. As shown in FIGS. 1 and 3, the X-axis slide 60 also carries a fiducial-mark imaging device in the form of a fiducial-mark camera 86 operable to take images of two fiducial marks 84 provided on each printed-wiring board 14, as shown in FIG. 9. The fiducial-mark camera 86 is a CCD camera, which is movable with the component-holding head 40 by the XY robot 42, within an area which substantially entirely overlaps the component mountable area (movable area) 70 of the component-holding head 40.

Each component-mounting device 12 is provided with a component imaging device in the form of a component camera 90, which is located between the component-supplying device 30 and the PWB transferring device 18 (PWB conveyor 20) in the Y-axis direction, as indicated in FIG. 2. When the component-holding head 40 which has received the electronic component 16 from the component-supply device 30 is moved in the Y-axis direction, past this component camera 90 toward the printed-wiring-board 14 as held by the PWB holding device 24. The component camera 90 is a CCD camera operable to take an image of the electronic component 16 as held by the component-holding head 40, in an upward direction. Near the component camera 90, there is provided an illuminating device operable to irradiate the electronic component 16 and its vicinity when the image of the electronic component 16 is taken by the component camera 90. The component camera 90 may be a line scan camera.

Figure 5:
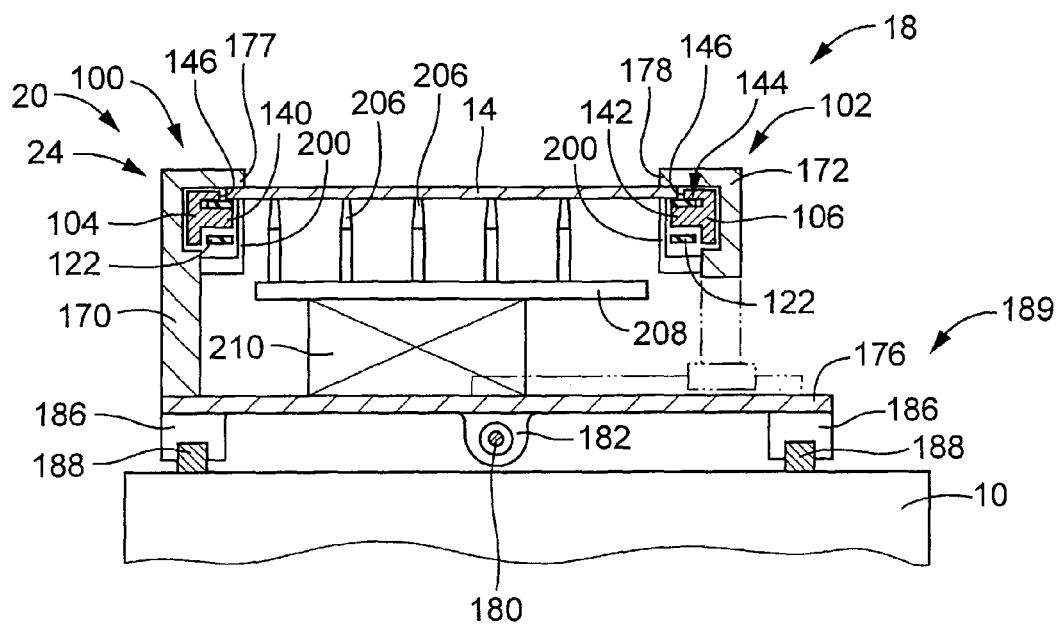
FIG. 5 is a side elevational view in cross section schematically showing the substrate-transferring device and the substrate-holding device.

As shown in FIG. 5, the PWB conveyor 20 includes a pair of parallel guides 100, 102. The guides 100, 102 have respective elongate main bodies 104, 106 each having a rectangular shape in transverse cross section. The main bodies 104, 106 extend in the X-axis direction in the horizontal plane. The guide 100 is a stationary guide, while the other guide 102 is a movable guide movable in the Y-axis direction toward and away from the stationary guide 100.

Figure 6:
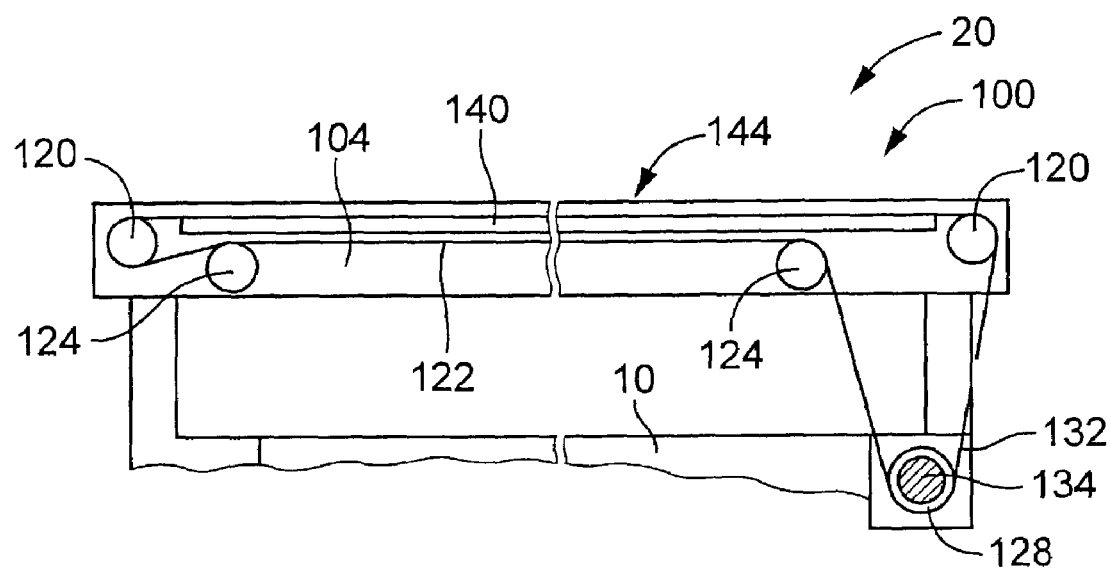
FIG. 6 is a front elevational view in cross section of the substrate-transferring device.

Each one of the main bodies 104, 106 of the two guides 100, 102 is provided with two driven pulleys 120 rotatably supported on its surface opposed to the corresponding surface of the other main body 104, as schematically shown in FIG. 6 with respect to the main body 104 of the guide 100 by way of example. The two driven pulleys 120 are located at the respective opposite longitudinal ends which are spaced from each other in the X-axis direction. The endless conveyor belt 122 indicated above is held in engagement with the driven pulleys 120. Thus, the PWB conveyor 20 used in the present system is a belt conveyor. The conveyor belt 122 is guided by two guide pulleys 124 also rotatably supported by the main body 104. The conveyor belt 122 provided on the guide 100 is also held in engagement with a driving pulley 128, which is fixed to an output shaft of a drive source or an electric motor in the form of a conveyor motor 132. The driving pulley 128 is fixed to one end of a spline shaft 134 which is rotatably supported at its opposite ends by the main body 104 and a frame (not shown). One of the driven pulleys 120 of the guide 102 is splined to the other end of the spline shaft 134. This driven pulley 120 of the guide 102 is rotatably and axially immovably supported by the main body 106 of the guide 102. In this arrangement, a rotary motion of the conveyor motor 132 causes the driving pulley 128 and the driven and guide pulleys 120, 124 of the guide 100 to be rotated, and at the same time causes the spline shaft 135 to be rotated, thereby rotating the driven pulleys 120 of the guide 102, so that the two conveyor belts 122 are rotated in synchronization with each other through the spline shaft 134.

As shown in FIG. 5, two belt guides 140, 142 are provided integrally with the respective opposed surfaces of the main bodies 104, 106 such that the belt guides 140, 142 extend in the X-axis direction in the horizontal plane. The belt guides 140, 142 support the respective conveyor belts 122 in contact with the lower surfaces of their straight portions 144. The printed-wiring board 14 is supported by the belt guides 140, 142, at its opposite end portions extending in the X-axis direction, in contact with the upper surfaces of the straight portions 144. With the conveyor belts 122 being rotated, the printed-wiring board 14 is transferred in the X-axis direction. That is, the belt conveyors 122 supported by the horizontal guides 100, 102 support and transfer the printed-wiring board 14 while the board 14 is held in its horizontally extending attitude. As shown in FIG. 5, the main bodies 104, 106 of the guides 100, 102 have respective vertical guiding surfaces 146 which are opposed to each other in the Y-axis direction and which are provided to guide the printed-wiring board 14, in sliding contact with the opposite side surfaces of the board 14. In the present embodiment, the main bodies 104, 106 are provided commonly for all of the four component-mounting devices 12, and the conveyor belts 122 have a length considerably larger than the length of the array of the four component-mounting devices 12. Namely, the length of the conveyor belts 122 permits the printed-wiring board 14 to be transferred from a position a predetermined distance upstream of the upstream end of the array of the component-mounting devices 12, to a position a predetermined distance downstream of the downstream end of the array.

Figure 7:
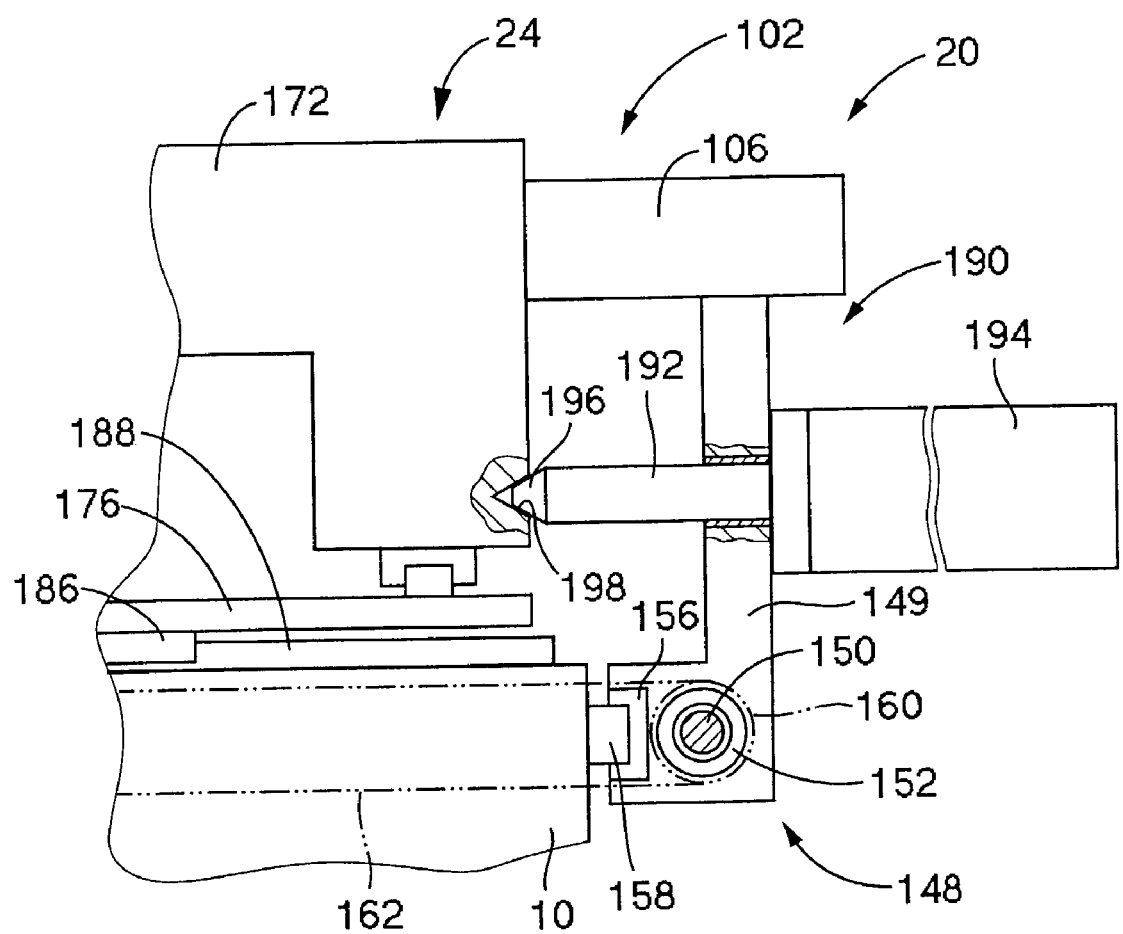
FIG. 7 is a front elevational view in cross section schematically showing a linking device arranged to operatively link the substrate-transferring device and the substrate-holding device when their effective widths are changed.

The guide 102 is movable by a width changing device 148 shown in FIG. 7, toward and away from the other guide 100, to adjust a distance between the guides 100, 102, that is, an effective width of the PWB conveyor 20, depending upon the specific width of the printed-wiring board 14. The main body 106 of the guide 102 is supported by the machine base 10, through a pair of support portions 149 formed integrally with the longitudinally opposite end portions of the main body 106 which are spaced from each other in the X-axis direction. The main body 106 is movable relative to the machine base 10 in the Y-axis direction (perpendicular to the X-axis direction). In FIG. 7, only one of the two support portions 149 is shown. A pair of feedscrews 150 are attached to the machine base 10 such that each feedscrew 150 is rotatable and axially immovable relative to the machine base 10. A pair of nuts 152 are fixed to the respective support portions 149, and are held in engagement with the respective feedscrews 150. When the feedscrews 150 are rotated by a drive source or electric motor in the form of a width changing motor 154 (shown in FIG. 8), the guide 102 is moved in the Y-axis direction. Each of the two feedscrews 150 has a sprocket wheel 160 fixed at its one end, and the two sprocket wheels 160 fixed to the two feedscrews 150 are connected to each other by a chain 162. These sprocket wheels 160 and the chain 162 cooperate to constitute a rotation transmitting device operable to transmit a rotary motion of one of the two feedscrews 150 to the other feedscrew 150. In this arrangement, the two feedscrews 150 are rotated in synchronization with each other by the width changing motor 154. The guide 102 is guided by a guiding device, which includes a pair of guide blocks 156 fixed to the respective support portions 149, and a pair of guide rails 158 fixed to the side surfaces of the machine base 10. The width changing device 148 includes the above-indicated rotation transmitting device, and the feedscrews 150, nuts 152, width changing motor 154.

Figure 4:
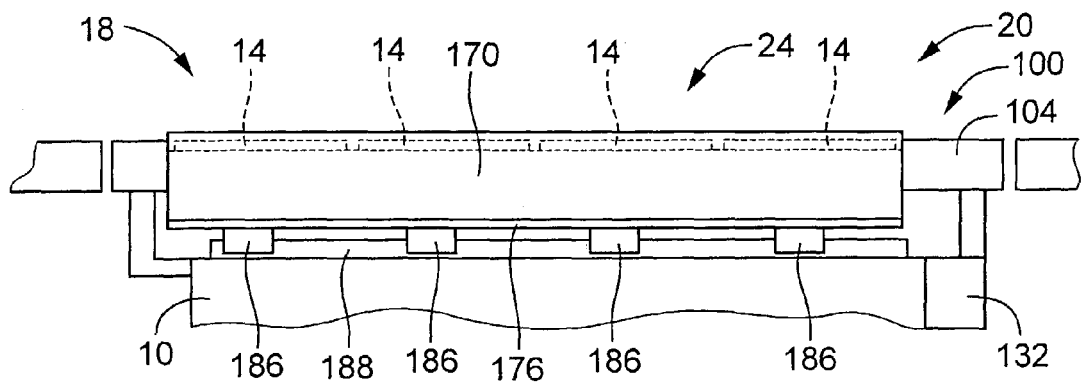
FIG. 4 is a front elevational view schematically showing a substrate-transferring device and a substrate-holding device of the electronic-component mounting system.

As shown in FIGS. 4 and 5, the PWB holding device includes a pair of parallel holder members 170, 172, each of which is an elongate member having a generally rectangular shape in transverse cross section. The holder members 170, 172 are supported by a main body of the PWB holding device in the form of a support block 176, such that the holder members 170, 172 extend in the X-axis direction. The holder members 170, 172 have respective integrally formed presser portions 177, 178 extending toward each other in the Y-axis direction. These holder members 170, 172 are provided commonly for all of the four component-mounting devices 12.

The support block 176 is mounted on the machine base 10 such that the support block 176 is movable relative to the machine base. 10 in the X-axis direction. As shown in FIG. 5, the machine base 10 is provided with a feedscrew 180 fixed thereto such that the feedscrew 180 is rotatable and axially immovable relative to the machine base 10. The support block 176 is provided with a nut 182 fixed thereto such that the nut 182 is neither axially movable nor rotatable relative to the support block 176. The nut 182 is held in engagement with the feedscrew 180. When the feedscrew 180 is rotated by a drive source or electric motor in the form of a support-block drive motor 184 (shown in FIG. 8), the support block 176 is moved in the X-axis direction, while being guided by a guiding device including a plurality of guide blocks 186 and a pair of guide rails 188. The feedscrew 180 and the nut 182 cooperate to constitute a motion converting device operable to convert a rotary motion of the support-block drive motor 184 into a linear motion of the support block 176, while the support block 176, feedscrew 180, nut 182, support-block drive motor 184, guide blocks 186 and guide rails 188 cooperate to constitute a holding-device moving device operable to move the PWB holding device 24 in the X-axis direction by a maximum distance shorter than the maximum distance of movement of the printed-wiring board 14 by the PWB conveyor 20. In the present embodiment, the feedscrew 180 of the holding-device moving device is fixed to the machine base 10, while the nut 182 of the same device is fixed to the main body of the PWB holding device 24 in the form of the support block 176, such that the feedscrew 180 and the nut 182 are not axially movable.

The holder member 172 is disposed on the support block 176 such that the holder member 172 is movable in the Y-axis direction toward and away from the other holder member 170. The holder member 172 is moved by two latching devices 190 (one of which is shown in FIG. 7), toward and away from the holder member 170, together with the guide 102, so that a distance between the two holder members 170, 172 is adjusted when the distance between the two guides 100, 102 is adjusted. In the present embodiment, the latching devices 190 are disposed on the opposite sides of the holder member 172 and are spaced apart from each other in the X-axis direction. Each latching device 190 is constituted by a movable engaging member 192 supported by the support portion 149 movably in the X-axis direction, a drive source or fluid-operated actuator in the form of an air cylinder 194 for moving the engaging member 192, and an engaging recess 196 which is formed on the holder member 172 and which is engageable with an engaging end portion 196 of the engaging member 192. The engaging end portion 196 has a conical or tapered shape with its diameter continuously decreasing in a direction toward the extreme end, while the engaging recess 198 has a conical or tapered shape with its diameter continuously deceasing in a direction toward the bottom. In the present embodiment, the engaging member 192 is formed integrally with a piston rod of the air cylinder 194. Normally, the engaging member 192 is located at its retracted position at which the engaging end portion 196 is spaced apart from the engaging recess 198. When the width of the printed-wiring board 14 to be transferred by the PWB conveyor 20 is changed, the engaging member 192 is moved to its advanced position for engagement of the engaging end portion 196 with the engaging recess 198. To change the width of the PWB conveyor 20, the guide 102 (and the belt conveyor 122 supported by this guide 102) and the holder member 172 are moved in the Y-axis direction. Before this movement, the air cylinder 194 of each latching device 190 is activated to advance the engaging member 192 to its advanced position for engagement of the engaging end portion 196 with the engaging recess 198 of the holder member 172. In this condition, the guide 102 is moved in the Y-axis direction by the width changing device 148, while at the same time the holder member 172 now connected to the guide 102 through the latching device 190 and the support portion 149 is moved together with the guide 102. While the engaging members 192 of the latching devices 190 are located at their retracted positions, the movements of the holder members 170, 172 are not disturbed by the latching devices 190. In the present embodiment, the guide 102 and the holder member 172 are both moved by the drive source in the form of the width changing motor 154 of the width changing device 148, the guide 102 and the holder member 172 may be moved by respective drive sources in synchronization with each other.

As shown in FIG. 5, the holder members 170, 172 have respective support members 200 supported on their opposed surfaces such that the support members 200 are vertically movable. These support members 200 constitute a part of the PWB holding device 24. Each support member 200 takes the form of a plate which is elongated in the X-axis direction and located on an inner side of the corresponding conveyor belt 122 remote from the outer side surface of the holder member 170, 172 as seen in the Y-axis direction. The support members 200 are normally held at their lower positions under biasing actions of suitable biasing devices such as spring members (not shown), so that the support members 200 are spaced apart from the printed-wiring board 14 transferred by the conveyor belts 122. When the support members 200 are moved to their upper positions in synchronization with an elevator drive device 210 (which will be described), the support members 200 come into contact with the lower surface of the printing-wiring board 14, push up the board 14 away from the conveyor belts 122, and eventually force the board 14 against the presser portions 177, 178 of the holder members 170, 172. Thus, the printed-wiring board 14 is gripped by and between the support members 200 and the presser portions 177, 178, at the lateral ends of the board 14 which are opposed to each other in the Y-axis direction perpendicular to the direction of transfer of the board 14. Described more specifically, the board 14 is gripped by and between the support members 200 and the presser portions 177, 178, at their portions which are slightly inwardly spaced from the lateral end portions at which the board 14 is supported by the conveyor belts 122. An example of the structure for gripping the printed-wiring board 14 is disclosed in JP-A-11-204995.

The PWB holding device 24 is provided with a plurality of support members in the form of support pins 206, as schematically shown in FIG. 5. These support pins 206 are supported by an elevator plate 208, which is elevated and lowered by the above-indicated elevator drive device 210. When the support pins 206 are located at their upper position, the support pins 206 are held in contact with the lower surface of the printed-wiring board 14, while forcing the board 14 onto the presser portions 177, 178 with a vertical spacing distance left between the conveyor belts 122 and the lower surface of the board 14. In the present embodiment, the elevator drive device 210 uses a drive source or fluid-operated actuator in the form of an air cylinder 212 (shown in FIG. 8). While the elevator plate 208 and the elevator drive device 210 are commonly used for all of the four component-mounting devices 12 in the present embodiment, one set of the elevator plate 208 and the elevator drive device 210 may be used commonly for each set of two adjacent ones of the component-mounting devices 12. In this case, the two elevator plates 208 are elevated and lowered by the respective two elevator drive devices 210, in synchronization with each other. Alternatively, each of the four component-mounting devices 12 is provided with a set of the elevator plate 208 and the elevator drive device 210.

In the present electronic-component mounting system, the four printed-wiring boards 14 are movable by a movement of the support block 176 in the X-axis direction by a maximum distance shorter than the maximum distance of movement of the boards 14 by the PWB conveyor 20, while the boards 14 are held upwardly apart from the conveyor belts 122 and gripped by and between the presser portions 177, 178, and the support members 200 and support pins 206 in the vertical direction.

While the four stopper devices 22 to stop the printed-wiring boards 14 are provided in the present electronic-component mounting system, sensors for detecting deceleration-start positions and sensors for detecting stop positions may be provided in place of or in addition to the stopper devices 22, so that deceleration of each printed-wiring board 14 is initiated at the detected deceleration-start position, and the board 14 is stopped at the detected stop position. Each of these sensors may be a photoelectric sensor of reflection type or light-transmitting type including a light-emitting portion and a light-receiving or photosensitive portion, or alternatively a proximity switch or a limit switch.

The present electronic-component mounting system includes a control device 240. FIG. 8 shows this control device 240 and some elements of the mounting system which relate to the present invention. The control device 240 is principally constituted by a computer 241 incorporating a processing unit (PU) 242, a read-only memory (ROM) 244, a random-access memory (RAM) 246, an input port 248 and an output port 250, which are interconnected to each other through a bus line.

To the input port 248, there are connected various detectors and computers including the above-described fiducial-mark cameras 86 and component cameras 90, an image data processing computer 260 for processing image data obtained by those cameras 86, 90, and encoders 262, 264, 266 and 268 for detecting the amounts of operation of the above-indicated Y-axis drive motors 58, X-axis drive motors 64, conveyor motor 132 and support-block drive motor 184. To the output port 250, there are connected through driver circuits 270 various actuators including the above-described stopper elevating and lowering device 28, Y-axis drive motors 58, X-axis drive motors 64, head elevating and lowering devices 80, head rotating devices 82, conveyor motor 132, width changing motor 154, support-block drive motor 184, control valves for the air cylinders 194, 212. As described above, the operating amounts or angles of the Y-axis drive motors 58, X-axis drive motors 64, conveyor motor 132 and support-block drive motor 184 are detected by the respective encoders 262, 264, 266, 268, and these motors 58, 64, 132, 184 are controlled with high accuracy on the basis of the detected operating amounts. The ROM 244 stores control programs for controlling a component-mounting operation of the present system in general, and the RAM 246 stores various programs including: a program for transferring the printed-wiring boards 14 onto the individual component-mounting devices 12; a program for positioning the component-holding heads 40 of the component-mounting devices 12 according to kinds of the electronic components 16, mounting spots and order at and in which the electronic components 16 are to be mounted on the printed-wiring boards 14; and a program for positioning the fiducial mark cameras 86 of the component-mounting devices 12.

Referring next to FIG. 9, there will be described the component-mounting operation of the present electronic-component mounting system to mount the electronic components 16 on the printed-wiring boards 14. It is noted that FIG. 9 schematically shows the component-mounting devices 12 and the printed-wiring boards 14, for easy understanding of the relative positions between the component-mounting devices 12 and the printed-wiring boards 14.

Initially, the four printed-wiring boards 14 are transferred by the conveyor belts 122 of the PWB conveyor 20, and stopped by the respective stopper devices 22 provided in the respective component-mounting devices 12. The four printed-wiring boards 14 are positioned such that one of the two fiducial marks 84 which is located downstream of the other in the X-axis direction (direction of transfer of the boards 14) is located within the movable area of the fiducial-mark camera 86. This fiducial mark 84 located within the movable area of the fiducial-mark camera 86 will be referred to as the "downstream fiducial mark 84". In FIG. 9, the movable area of the fiducial-mark camera 86, which entirely overlaps the component mountable area of the component-holding head 40, is indicated by hatching lines (inclined upwards as they extend rightwards). After the four printed-wiring boards 14 are thus positioned in place in the respective component-mounting devices 12, the air cylinder 212 is activated to elevate the elevator plate 208 to its elevated position, so that the boards 14 are lifted by the support members 200, away from the conveyor belts 122, and forced against the presser portions 177, 178, whereby the boards 14 are concurrently gripped or held in the vertical direction at their lateral end portions. At the same time, each board 14 is supported at local portions of its lower surface between the two support members 200, by the plurality of support pins 206 located at the upper position as a result of the activation of the air cylinder 212.

The four printed-wiring boards 14 thus held by the PWB holding device 24 are shown in the uppermost view of FIG. 9. In this state, the fiducial-mark camera 86 of each component-mounting device 12 is moved by the XY robot 42, to a nominal position of the downstream fiducial mark 84. Images of the downstream fiducial marks 84 on the four boards 14 are simultaneously taken by the respective fiducial-mark cameras 86 of the component-mounting devices 12. Then, the support block 176 is moved relative to the fiducial-mark camera 86 by the support-block drive motor 184 in the downstream direction in the X-axis direction by a predetermined short distance L1 so that the other fiducial mark 84 (hereinafter referred to as the "upstream fiducial mark 84") is located within the movable area of the fiducial-mark camera 86, as shown in the intermediate view of FIG. 9. In this state, the fiducial-mark cameras 86 are moved to nominal positions of the upstream fiducial marks 84, and the images of these upstream fiducial marks 84 are simultaneously taken by the fiducial-mark camera 86. Image data thus obtained by the fiducial-mark cameras 86 are processed by the image data processing computer 260, to obtain the actual positions of the fiducial marks 84 on the four printed-wiring boards 14. The obtained image data of the fiducial marks 84 are stored in the RAM 246, in relation to the four fiducial-mark cameras 86. The image data processing computer 260 compares the positions of the fiducial marks 84 represented by the obtained image data, with the nominal positions stored in the RAM 246, to calculate actual positioning errors of the fiducial marks 84 with respect to the nominal positions. On the basis of the thus calculated positioning errors of the fiducial marks 84, the movement distance L1 of the support block 176 and a movement distance of the fiducial-mark camera 86, the PU 242 calculates positioning errors in the X-axis and Y-axis directions of each printed-wiring board 14 as held by the PWB holding device 24.

Then, the four component-holding heads 40 of the four component-mounting devices 12 are moved by the XY robots 42 are moved to respective positions right above the component-supply portions of the selected tape feeders 34 of the respective component-supplying devices 30, and the suction nozzles 68 are lowered by the head elevating and lowering devices 80, to receive the electronic components 16 from the selected tape feeders 34. Then, the component-holding heads 40 are moved to component-imaging positions, at which images of the electronic components 16 as held by the suction nozzles 68 are taken by the component cameras 90. Subsequently, the component-holding heads 40 are moved by the XY robots 40, to positions right above the nominal positions of the component-mounting spots on the printed-wiring boards 14. For accurate positioning of the electronic components 16 on the boards 14, however, the positions to which the component-holding heads 40 are moved to mount the electronic components 16 on the printed-wiring boards 14 are adjusted for compensation for the positioning errors of the boards 14 and positioning errors of the electronic components 16, and for other reasons. After the images of the electronic components 16 are taken by the component cameras 90 and during the movements of the component-holding heads 40 toward the component-mounting spots on the boards 14, obtained image data of the electronic components 16 are processed to obtain horizontal positioning errors (X-axis and Y-axis positioning errors) and an angular positioning error of each electronic component 16 as held by the corresponding suction nozzle 68. The component-holding head 40 (suction nozzle 68) is rotated by a suitable angle by the head rotating device 82, to eliminate the angular positioning error of the electronic component 16. Where the angular position of the electronic component 16 as held by the suction nozzle 68 is different from that of the electronic component 16 as mounted on the board 14, the component-holding head 40 is rotated by an angle required to eliminate the angular positioning error of the component 16 and to mount the component 16 on the board 14 in the predetermined angular position. The positions at which the component-holding heads 40 (suction nozzles 68) are moved to mount the electronic components 16 are adjusted by adjusting the nominal distances of movements of the heads 40 in the X-axis and Y-axis directions, so as to eliminate the obtained positioning errors of the boards 14, the obtained horizontal positioning errors of the electronic components 16, and horizontal positioning errors of the electronic components 16 which are generated as a result of rotation of each component-holding head 40 to eliminate the angular positioning error of the electronic component 16 and to establish the predetermined the angular position in which the electronic component 16 is mounted on the board 14. The component-holding heads 40 are moved by the adjusted distances of movements, and the suction nozzles 68 are lowered to mount the electronic components 16 on the boards 14. The operations to eliminate the positioning errors of the boards 14 and the electronic components 16 and the operations to mount the electronic components 16 on the boards 14 are concurrently performed in the four component-mounting devices 12.

After a set of predetermined electronic components 16 has been mounted in an area of each printed-wiring board 14 corresponding to the component mountable area of the corresponding component-mounting device 12, the support block 176 is moved in the upstream direction by the above-indicated distance L1 relative to the component-mounting devices 12, so that the component-holding heads 40 are movable in an area of the boards 14 in which the electronic components 16 have not been mounted. This area is indicated by cross-hatching lines in the lowermost view of FIG. 9. Then, another set of predetermined electronic components 16 is mounted in this area of the board 14. In this case, too, the distances of movements of the suction nozzles 68 (component-holding heads 40) are adjusted to eliminate the positioning errors of the boards 14, the horizontal positioning errors of the electronic components 16 as held by the suction nozzles 68, and the horizontal positioning errors of the electronic components 16generated as a result of rotation of each component-holding head 40 to eliminate the angular positioning error of the electronic component 16 and to establish the predetermined the angular position of the electronic component 16 as mounted on the board 14.

It will be understood from the foregoing description of the present embodiment that the XY robots 42 function as a head-moving device operable to move the component-holding heads 44, and that the PWB transferring device 18 functions as a substrate-transferring device operable to transfer circuit substrates in the form of the printed-wiring boards 14. It will also be understood that the PWB conveyor 20 functions as a first transferring deice operable to transfer the circuit substrates, while the PWB holding device 24 and the holding-device moving device 189 cooperate to constitute a second transferring device operable to transfer the circuit substrates. It will further be understood that the presser portions 177, 178 of the holder members 170, 172, the support members 200 and the support pins 206 cooperate to constitute a holder portion for fixedly holding the circuit substrates. It is noted that the support pins 206 as well as the support members 200 function as support members for supporting each circuit substrate in the form of the printed-wiring board 14, at one or more points on its lower surface. It will also be understood that the guides 100, 102 constitute a main body of the first transferring device, and that the fiducial-mark cameras 86 function as an imaging device operable to image the fiducial marks 84, while the image data processing computer 260 functions as an image data processing device operable to obtain the positioning errors of the circuit substrates as held by the PWB holding device 24, on the basis of a result of imaging of the fiducial marks 84. It will further be understood that a portion of the control device 240 assigned to operate the fiducial-mark cameras 86 to image one and the other of the two fiducial marks 84 before and after the movement of the PWB holding device 24, respectively, provides an imaging control device. It will also be understood that the image data processing computer 260 which functions as the image data processing device includes a first positioning-error obtaining portion operable to the positioning errors of the printed-wiring boards 14 as held by the PWB holding device 24, on the basis of the positioning errors of the plurality of fiducial marks 84 obtained before and after the movement of the PWB holding device.

In the present embodiment, the printed-wiring boards 14 held and positioned by the PWB holding device 24 can be linearly reciprocated in the X-axis direction by a relatively short maximum distance, so that the fiducial marks 84 provided on each printed-wiring board 14 can be imaged by the fiducial-mark camera 86 provided in each component-mounting device 12, when the electronic components 16 are mounted on the printed-wiring board 14, even where the size of the board 14 is larger than that of the component mountable area of the component-mounting device 12. Accordingly, the electronic components 16 can be mounted on each printed-wiring board 14 with high positioning accuracy. Further, the distance of movement of the printed-wiring boards 14 held by the PWB holding device 24 is relatively small, so that the time required for moving the boards 14 is accordingly short, and the mounting operation can be performed with high efficiency with a reduced non-productive time. In the present embodiment, the maximum distance of movement of the PWB holding device 24 is not larger than a center-to-center distance of the adjacent component-mounting devices 12. Described more specifically, the maximum distance L1 (indicated in FIG. 9) of the PWB holding device 24 is not larger than a distance L2 (indicated in FIG. 9) between the mutually opposed ends of the component mountable areas of the two adjacent component-mounting devices 12. The maximum distance of movement of the PWB holding device 24 may be selected within a range between L1 and L2. Since the PWB holding device 24 is moved by only a short distance to move the printed-wiring boards 14, the accuracy of positioning of the boards 14 relative to the component-mounting devices 12 can be easily enhanced. Thus, the component-mounting devices 12 permit accurate mounting of the electronic components 16 on the printed-wiring boards 14 even where the dimension of the component mountable area of each component-mounting device 12 in the X-axis direction is smaller than the corresponding dimension of the printed-wiring boards 14. Accordingly, the present electronic-component mounting system can be made relatively compact in construction and small-sized, so that the required installation space of the system can be reduced.

In the present electronic-component mounting system, the upstream fiducial mark 84 is first imaged, and then the downstream fiducial mark 84 is imaged after a movement of the printed-wiring boards 14 in the upstream direction by a short distance L1 back to the original positions, at which the component mounting operations on the boards 14 are initiated. This order of imaging of the two fiducial marks 84 is different from that shown in FIG. 9.

In the illustrated embodiment, each printed-wiring board 14 is larger than the component mountable area of each component-mounting device 12 and the dimension of the printed-wiring board 14 in the X-axis direction is not larger than a distance between the component mountable areas of the adjacent component-mounting devices 12. Namely, the two fiducial marks 84 provided on each printed-wiring board 14 are not located within the movable area of the corresponding fiducial-mark camera 86, but the two fiducial marks 84 can be imaged one after the other by moving the PWB holding device 24 to move the printed-wiring boards 14. However, the electronic components 16 can be mounted on the basis of the positioning errors of the printed-wiring boards 14 as held by the PWB holding device 24, even where the size of each board 14 is smaller than the component mountable area of each component-mounting device 12, or the dimension of the board 14 in the X-axis direction is larger than the distance between the component mountable areas of the adjacent component-mounting devices 12.

Figure 10:
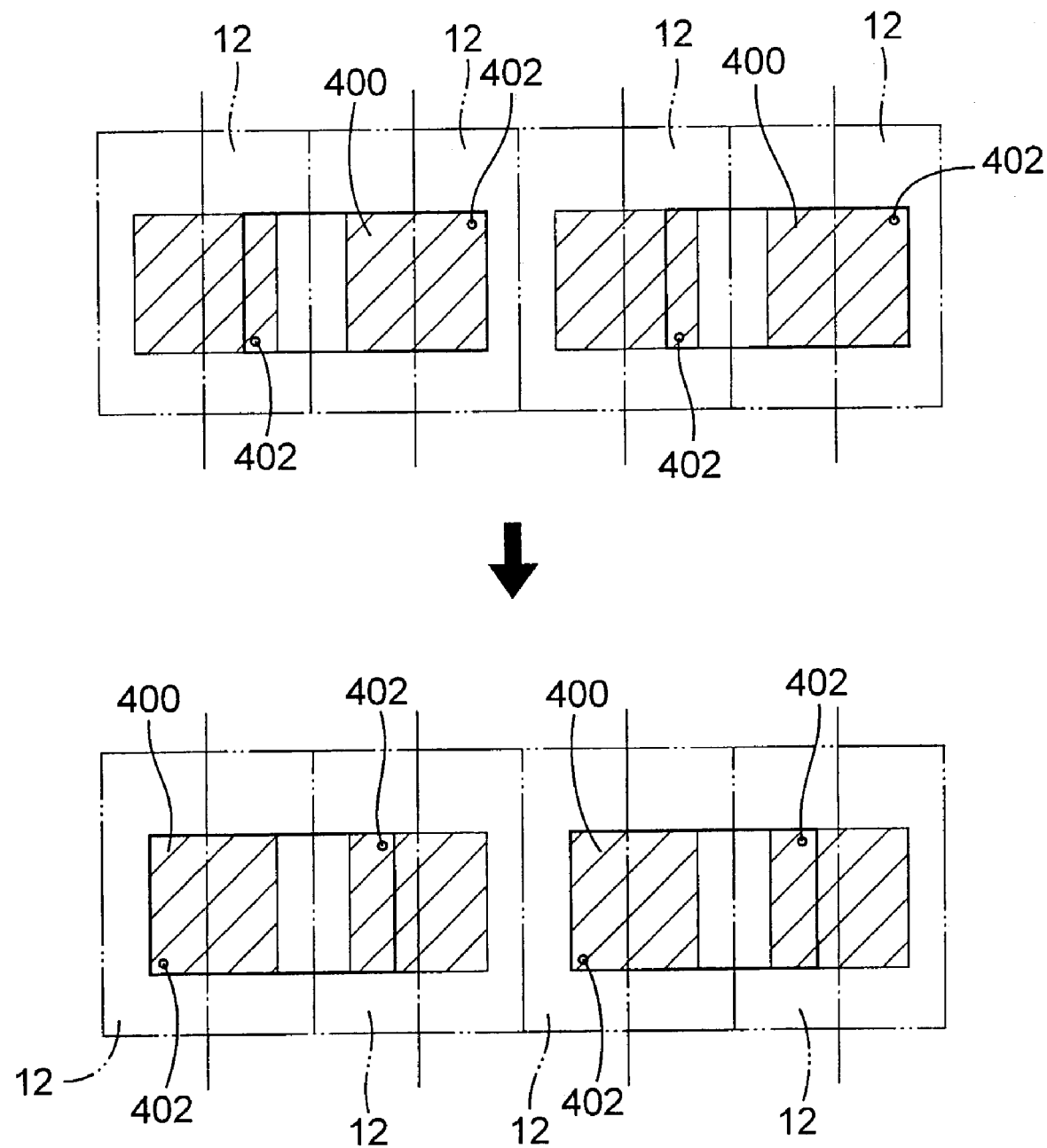
FIG. 10 is a view for explaining another example of the operations to image the fiducial marks and mount the electronic components in the electronic-component mounting system.

In an example of FIG. 10, the dimension of each printed-wiring board 400 in the X-axis direction is larger than a distance between the component mountable areas of the adjacent two component-mounting devices 12 (between the movable areas of the adjacent two fiducial-mark cameras 86. In this case, two fiducial marks 402 provided on each printed-wiring board 400 are imaged by the respective adjacent two fiducial-mark cameras 86, and the obtained image data are processed by the image data processing computer 260. The example of FIG. 10 will be described with respect to the operations of the two fiducial mark cameras 86 and the corresponding two component-mounting devices 12. In FIG. 10, the component mountable areas of the component-mounting devices 12 (movable areas of the fiducial-mark cameras 86) are indicated by hatching lines (inclined upwards as they extend rightwards).

In the example of FIG. 10 wherein the adjacent two fiducial-mark cameras 86 are operated to image the respective two fiducial marks 402 provided on one printed-wiring board 400, it is desirable to obtain relative positioning errors of these two fiducial-mark cameras 86. To this end, a test or reference board (which may be a printed-wiring board) having at least three fiducial marks is prepared. These fiducial marks are positioned relative to each other such that at least two of these fiducial marks can be imaged by one fiducial-mark camera 86 while at least one other fiducial mark can be imaged by the adjacent fiducial-mark camera 86. The relative positions of these at least three fiducial marks on the test board should be known. This test board is transferred by the PWB conveyor 20 and positioned and held by the PWB holding device 24, such that the at least two fiducial marks can be imaged by one fiducial-mark camera 86 while the at least one other fiducial mark 86 can be imaged by the adjacent fiducial-mark camera 86. In this state, the two fiducial-mark cameras 86 are moved and operated to take the images of the fiducial marks on the test board. On the basis of the thus obtained image data, positioning errors of one of the two fiducial-mark cameras 86 relative to the other fiducial-mark camera 86 (positioning errors of the downstream fiducial-mark camera 86 relative to the upstream fiducial-mark camera 86) in the X-axis and Y-axis directions are obtained and stored in the RAM 246 of the control device 240. The relative positioning errors of the adjacent two fiducial-mark cameras 86 may be obtained in the following manner, for example. Initially, positioning errors of the test board as held by the PWB holding device 24 are calculated on the basis of the positioning errors of the at least two fiducial marks imaged by one of the two fiducial-mark cameras 86, for instance, by the downstream camera 86. Then, positioning errors of the at least one fiducial mark imaged by the other (upstream) fiducial-mark camera 86. On the basis of the thus obtained positioning errors of the at least one fiducial mark and the previously obtained positioning error of the test board, the positioning errors of the upstream fiducial-mark camera 86 with respect to the downstream fiducial-mark camera 86 are obtained. For improving the accuracy of detection of the positioning errors of the test board as held by the PWB holding device 24, the at least two fiducial marks imaged by one of the two fiducial-mark cameras 86 are desirably spaced apart from each other by a distance or distances as large as possible to permit simultaneous imaging of these at least two fiducial marks by the one fiducial-mark camera 86.

When the electronic components 16 are actually mounted on the printed-wiring boards 400, these boards 400 are transferred by the PWB conveyor 20, and positioned and held by the PWB holding device 24. In the example of FIG. 10, each of the two printed-wiring boards 400 is stopped by the stopper device 22 of the downstream one of the adjacent two component-mounting devices 12 corresponding to that board 400. The thus stopped board 400 is held by the PWB holding device 24. Then, the adjacent two fiducial-mark cameras 86 are moved to respective positions right above the two fiducial marks 402 which are spaced apart from each other, as indicated in the upper view of FIG. 10. At this time, the distance of movement of the upstream fiducial-mark camera 86 is adjusted to eliminate the positioning errors of the upstream fiducial-mark camera 86 with respect to the downstream fiducial-mark camera 86. The thus moved fiducial-mark cameras 86 are operated to image the respective two fiducial marks 402, and the thus obtained image data are processed by the image data processing computer 250, to obtain the actual positions of the fiducial marks 402. The thus obtained positions of the fiducial marks 402 are compared with reference or nominal positions stored in the RAM 246, to obtain positioning errors of the fiducial marks 402. On the basis of the thus obtained positioning errors of the fiducial marks 402, the X-axis and Y-axis positioning errors and angular positioning error of the printed-wiring board 400 are calculated. The angular positioning error of the board 400 is an error of angular positioning about an axis normal to the plane of the board 400. On the basis of the X-axis and Y-axis and angular positioning errors of the board 400, the distances of movement (stop positions) of the two component-holding heads 40 are adjusted, and the component-holding heads 40 are moved by the adjusted distances of movements to mount the electronic components 16 in an area of the printed0-wiring board 400 corresponding to the component mountable areas of the component-mounting devices 12. In the position of the board 400 indicated in the upper view of FIG. 10, the upstream end portion of the board 400 lies within the component mountable area of the upstream component-mounting device 12. The electronic components may or may not be mounted in this upstream end portion of the board 400. In the former case, the preparation of a component-mounting program is complicated, but the efficiency of the component-mounting operation on the board 400 can be improved.

After a set of predetermined electronic components 16 has been mounted in the areas of the board 400 lying within the component mountable areas of the adjacent two component-mounting devices 12, the PWB holding device 24 is moved in the upstream direction to move the board 400 by a predetermined distance, as indicated in the lower view of FIG. 10, so that another set of predetermined electronic components is mounted in an area of the board 400 in which the electronic components have not been mounted and which is now located within the component mountable area of the upstream component-mounting device 12. As in the mounting of the electronic components on the board 400 located as indicated in the upper view of FIG. 10, the distance of movement of the upstream component-holding head 40 is adjusted for compensation for the horizontal and angular positioning errors of the board 400.

In the mode of operation of the electronic-component mounting system shown in FIG. 10, the image data processing computer 260 functions as a second positioning-error obtaining portion operable to obtain the positioning errors of the each printed-wiring board 400 as held by the PWB holding device 24, on the basis of the image data of the two fiducial marks 402 obtained by the two fiducial-mark cameras 86.

In the modes of operation of the system of FIGS. 9 and 10, the electronic components 16 are mounted, in the first mounting operation, in the entire portion of the predetermined component-mounting region of the board 14, 400 which portion is located within the component mountable area or areas of the component-mounting device or devices 12, and in the second mounting operation, in the other area of the board 14, 400 in which the electronic components 16 have not been mounted. However, the component-mounting program may be prepared so that the first mounting operation is performed in one half of the component-mounting region of the board 14, 400, while the second mounting operation is performed in the other half of the component-mounting region. Alternatively, the component-mounting program may be prepared so that the two areas of the board 14, 400 in which the first and second component-mounting operations are performed, respectively, partially overlap each other.

Figure 11:
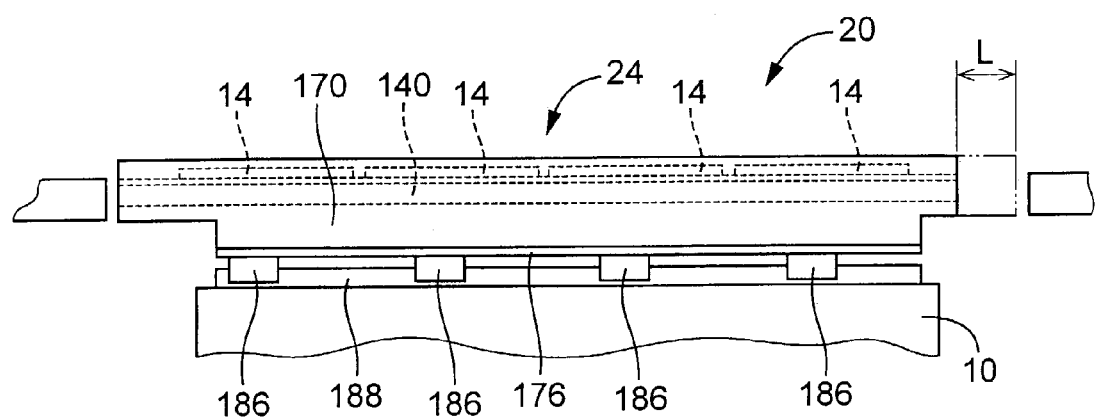
FIG. 11 is a front elevational view schematically showing a substrate-transferring device and a substrate-holding device in an electronic-component mounting system according to another embodiment of the present invention.

In the embodiment described above, the PWB holding device 24 is movable relative to the component-mounting devices 12 and the PWB conveyor 20. However, the PWB conveyor 20 may be moved together with the PWB holding device 24 relative to the component-mounting devices 12, by the holding-device moving device 189. In this case, each of the guides 100, 102 which constitute the main body of the PWB conveyor 20, and each of the holder members 170, 172 which constitute the main body of the PWB holding device 24 can be provided by a common structure, so that the PWB conveyor 20 can be simplified in construction. An example of this modification is shown in FIG. 11 as a second embodiment of this invention, wherein the belt guides 140, 142 of the PWB conveyor 20 are formed integrally with the holder members 170, 172 of the PWB holding device 24. In this second embodiment wherein the PWB conveyor 20 is moved together with the PWB holding device 24, it is necessary to provide spacing distances L between the present electronic-component mounting system and the adjacent devices, for permitting the movements of the PWB conveyor 20 and the PWB holding device 24 as a unit.

While the two preferred embodiments of the present invention have been described in detail, for illustrative purpose only, it is to be understood that the present invention may be embodied with various changes and improvements, such as those described in the SUMMARY OF THE INVENTION, which may occur to those skilled in the art.

What is claimed is:

1. An electric-component mounting system for mounting electric components on at least one circuit substrate, comprising:

a plurality of component-mounting devices which are arranged in series with each other and each of which includes a component-holding head operable to hold an electric component, and a head-moving device operable to move said component-holding head; and a substrate-transferring device disposed so as to extend along an array of said plurality of component-mounting devices and operable to move said at least one circuit substrate and stop said at least one circuit substrate at at least one stop position which respectively corresponds to at least one of said plurality of component-mounting devices and at which said at least one component-mounting device mounts said electric components on said at least one circuit substrate, and wherein said substrate-transferring device includes (a) a first transferring device operable to move said at least one circuit substrate, along at least a path from an upstream end to a downstream end of said array of said plurality of component-mounting devices, and stop said at lest one circuit substrate at least once during movement thereof along said path, and (b) a second transferring device comprising a substrate-holding device operable to fixedly hold said at least one circuit substrate at each of said at least one stop position established by said first transferring device, and a holding-device moving device operable to reciprocate said substrate-holding device in a direction of movement of said at least one circuit substrate by said first transferring device, by a maximum distance smaller than a maximum distance of movement of said at least one circuit substrate by said first transferring device, so that said at least one circuit substrate held by said substrate-holding device is moved together with said substrate-holding device.

2. An electric-component mounting system according to claim 1, wherein said first transferring device comprises a belt conveyor arranged to move said at least one circuit substrate while supporting each of said at least one circuit substrate in contact with a lower surface of said each circuit substrate.

3. An electric-component mounting system according to claim 2, wherein said substrate-holding device includes a holder portion arranged to grip said each circuit substrate in a vertical direction, at a first portion of said each circuit substrate which is spaced from a second portion thereof at which said each circuit substrate is supported on its lower surface by said belt conveyor of said first transferring device, said first portion being spaced from said second portion in a direction perpendicular to said direction of movement of said at least one circuit substrate by said first transferring device.

4. An electric-component mounting system according to claim 2, wherein said belt conveyor includes two conveyor units each including a conveyor belt, a belt guide and a belt drive device operable to rotate said conveyor belt, said two conveyor units supporting respective opposite lateral portions of said each circuit substrate parallel to said direction of movement of said at least one circuit substrate, and cooperating with each other to move said each circuit substrate.

5. An electric-component mounting system according to claim 4, wherein said substrate-holding device of said second transferring device includes at least one support member which is located between said two conveyor units and each of which supports said each circuit substrate in contact with said lower surface, at a corresponding one of at least one local position of said each circuit substrate between said two conveyor units.

6. An electric-component mounting system according to claim 4, wherein said substrate-holding device of said second transferring device includes two holder portions arranged to grip said each circuit substrate in a vertical direction, at respective portions of said each circuit substrate which are inwardly spaced from said opposite lateral portions thereof at which said each circuit substrate is supported on its lower surface by said two conveyor units.

7. An electric-component mounting system according to claim 4, wherein said substrate-holding device of said second transferring device includes two holder portions arranged to grip said each circuit substrate in a vertical direction, at respective opposite end portions of said each circuit substrate which extend outwardly from said opposite lateral portions thereof at which said each circuit substrate is supported on its lower surface by said two conveyor units.

8. An electric-component mounting system according to claim 1, wherein said first transferring device is moved together with said substrate-holding device by said holding-device moving device.

9. An electric-component mounting system according to claim 1, wherein said first transferring device includes a main body disposed immovably relative to said plurality of component-mounting devices, and said substrate-holding device is disposed movably relative to said main body of said first transferring device.

10. An electric-component mounting system according to claim 1, wherein each of said plurality of component-mounting devices includes an imaging device operable to obtain image data of fiducial marks provided on each of said at least one circuit substrate held by said substrate-holding device, said electric-component mounting system further comprising an image data processing device operable to positioning errors of said at least one circuit substrate as held by said substrate-holding device, on the basis of said image data of said fiducial marks obtained by said imaging device.

11. An electric-component mounting system according to claim 10, wherein said imaging device is moved with said component-holding head by said head-moving device.

12. An electric-component mounting system according to claim 1, wherein said substrate-holding device has a length larger than a distance between a downstream end of a component mountable area of a most downstream one of said plurality of component-mounting devices and an upstream end of a component mountable area of a most upstream one of said component-mounting devices.

13. An electric-component mounting system according to claim 1, wherein said plurality of component-mounting devices consist of at least three component-mounting devices arranged in series with each other.

14. An electric-component mounting system according to claim 13, wherein said at least three component-mounting devices are arranged at a predetermined constant pitch.

15. An electric-component mounting system according to claim 1, wherein said maximum distance of movement of said substrate-holding device by said holding-device moving device is not larger than a center-to-center distance of adjacent ones of said plurality of component-mounting devices.

16. An electric-component mounting system according to claim 15, wherein said maximum distance of movement of said substrate-holding device by said holding-device moving device is not larger than a spacing distance between component mountable areas of adjacent ones of said plurality of component-mounting devices.

17. An electric-component mounting system according to claim 10, wherein said fiducial marks consist of a plurality of fiducial marks provided at respective positions on said each circuit substrate, which positions which are spaced apart from each other, said electric-component mounting system further comprising an imaging control device operable to operate said imaging device to image at least one first fiducial mark selected from said plurality of fiducial marks before a movement of said substrate-holding device by said holding-device moving device, and at least one second fiducial mark selected from said plurality of fiducial marks after said movement of said substrate-holding device, said at least one second fiducial mark being different from said at least one first fiducial mark, and wherein said image data processing device includes a positioning-error obtaining portion operable to obtain the positioning errors of said each circuit substrate as held by said substrate-holding device, on the basis of positioning errors of said at least one first fiducial mark and said at least one second fiducial mark which have been imaged by said imaging device.

18. An electric-component mounting system according to claim 10, wherein said image data processing device includes a positioning-error obtaining portion operable to obtain the positioning errors of said each circuit substrate as held by said substrate-holding device, on the basis of image data of a plurality of fiducial marks which are provided on said each circuit substrate and which are imaged by at least two adjacent imaging devices of said plurality of component-mounting devices.

19. An electric-component mounting system according to claim 1, wherein said holding-device moving device includes a feedscrew and a nut which are held in engagement with each other and fixed axially immovably to one and the other of a main body of said substrate-holding device and a main body of the electric-component mounting system which movably supports said main body of said substrate-holding device, said holding-device moving device further including a motor whose operating angle is controlled with high accuracy and which is operated to rotate one of said feedscrew and said nut while the other of said feedscrew and said nut is prevented from being rotated.

20. An electric-component mounting system for mounting electric components on a circuit substrate, comprising:
at least one component-mounting device each including a component-holding head operable to hold an electric component, and a head-moving device operable to move said component-holding head;
a substrate-transferring device operable to move said circuit substrate to a stop position corresponding to each of said at least one component-mounting device, and to move said circuit substrate from said position;

a substrate-holding device operable to fixedly hold said circuit substrate which has been moved to said stop position by said substrate-transferring device; and a holding-device moving device operable to move said substrate-holding device in a direction of movement of said circuit substrate by said substrate-transferring device, and wherein a plurality of areas of said circuit substrate held by said substrate-holding device are located at respective positions corresponding to said at least one component-mounting device.

21. An electric-component mounting system according to claim 20, further comprising a control device for controlling said holding-device moving device to move said substrate-holding device, for successively moving said circuit substrate held by said substrate-holding device, such that said plurality of areas are located at said respective positions at which at least one component-mounting device is successively operated to mount said electric components in said respective areas.

* * * * *